United States Patent
Kanazawa

(10) Patent No.: US 10,958,247 B2
(45) Date of Patent: Mar. 23, 2021

(54) MULTIPLEXER, HIGH-FREQUENCY FRONT-END CIRCUIT, AND COMMUNICATION DEVICE

(71) Applicant: Murata Manufacturing Co., Ltd., Nagaokakyo (JP)

(72) Inventor: Tomio Kanazawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/896,262

(22) Filed: Jun. 9, 2020

(65) Prior Publication Data
US 2020/0304102 A1    Sep. 24, 2020

Related U.S. Application Data

(63) Continuation of application No. PCT/JP2018/045470, filed on Dec. 11, 2018.

(30) Foreign Application Priority Data

Dec. 12, 2017 (JP) .................. 2017-237798

(51) Int. Cl.
*H03H 9/64* (2006.01)
*H04B 1/40* (2015.01)
(Continued)

(52) U.S. Cl.
CPC .......... *H03H 9/6483* (2013.01); *H03H 9/145* (2013.01); *H03H 9/72* (2013.01); *H04B 1/40* (2013.01)

(58) Field of Classification Search
CPC .. H04B 1/0057; H03H 9/6483; H03H 9/0576; H03H 9/6433; H03H 9/64; H03H 9/644
See application file for complete search history.

(56) References Cited

U.S. PATENT DOCUMENTS

2004/0095206 A1 * 5/2004 Tsutsumi ............. H03H 9/6483
                                                                  333/133
2007/0030096 A1   2/2007 Nishihara et al.
(Continued)

FOREIGN PATENT DOCUMENTS

JP    2007-074698 A    3/2007
JP    2015-073207 A    4/2015
(Continued)

OTHER PUBLICATIONS

Official Communication issued in International Patent Application No. PCT/JP2018/045470, dated Feb. 26, 2019.

*Primary Examiner* — Kevin Kim

(74) *Attorney, Agent, or Firm* — Keating & Bennett, LLP

(57) ABSTRACT

A multiplexer includes a transmission-side filter connected to a common terminal and a transmission input terminal, and a reception-side filter connected to the common terminal and a reception output terminal, in which the transmission-side filter includes serial arm resonators, parallel arm resonators, and a parallel arm circuit. In an interdigital transducer electrode included in the serial arm resonator connected closest to the common terminal, an electrode finger pitch at a center portion in an arrangement direction of electrode fingers is maximum among electrode finger pitches of the interdigital transducer electrode, and electrode finger pitches at end portions in the arrangement direction are minimum among the electrode finger pitches of the interdigital transducer electrode.

22 Claims, 13 Drawing Sheets

(51) Int. Cl.
  *H03H 9/145* (2006.01)
  *H03H 9/72* (2006.01)

(56) References Cited

U.S. PATENT DOCUMENTS

| | | |
|---|---|---|
| 2009/0108960 A1 | 4/2009 | Igaki et al. |
| 2016/0056791 A1 | 2/2016 | Shimizu et al. |
| 2017/0244431 A1 | 8/2017 | Araki |
| 2018/0102755 A1* | 4/2018 | Takamine .......... H03H 9/02574 |
| 2018/0367121 A1 | 12/2018 | Yamada |

FOREIGN PATENT DOCUMENTS

| | | |
|---|---|---|
| JP | 2017-152881 A | 8/2017 |
| WO | 2005/067141 A1 | 7/2005 |
| WO | 2017/149878 A1 | 9/2017 |

* cited by examiner

INPUT FREQUENCY: 700~800MHz
GENERATION FREQUENCY: 2100~2400MHz

INPUT FREQUENCY: 600~670MHz
GENERATION FREQUENCY: 1800~2010MHz

MULTIPLEXER, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-237798 filed on Dec. 12, 2017 and is a Continuation Application of PCT Application No. PCT/JP2018/045470 filed on Dec. 11, 2018. The entire contents of each application are hereby incorporated herein by reference.

BACKGROUND OF THE INVENTION

1. Field of the Invention

The present invention relates to a multiplexer, a high-frequency front-end circuit, and a communication device, including an acoustic wave filter.

2. Description of the Related Art

In a multiplexer that demultiplexes or multiplexes a multiband high-frequency signal, a configuration in which a plurality of acoustic wave filters having a low loss and a high attenuation is connected to a common terminal has been widely used. However, when an input signal is increased, the acoustic wave filter generates a harmonic wave distortion component due to the nonlinearity thereof. When the harmonic wave distortion component increases, an electric power handling capability, noise performance, and the like of the acoustic wave filter deteriorate. Japanese Unexamined Patent Application Publication No. 2007-074698 discloses a configuration in which, in a ladder transmission-side acoustic wave filter, an arbitrary acoustic wave resonator is divided without changing electrostatic capacitance. According to this, the power consumption per unit area of the acoustic wave resonator subjected to serial division is reduced, the electric power handling capability can be improved, and InterModulation Distortion (IMD) can be reduced or prevented.

However, when the acoustic wave filter is applied as a single filter defining a multiplexer as in Japanese Unexamined Patent Application Publication No. 2007-074698, by intermodulation of a disturbance wave, input through a common terminal, corresponding to a combination of the sum or difference of the frequencies of the pass bands of respective filters and the nonlinear harmonic wave distortion component corresponding to the transmission band of the acoustic wave filter, an IMD having a frequency equal to that of a reception band of another filter is generated. Due to the influence of the IMD, reception sensitivity of the other filter deteriorates. That is, from a viewpoint of reducing or preventing deterioration in bandpass characteristics of the other filter connected to the common terminal, the IMD reduction or prevention of the acoustic wave filter disclosed in Japanese Unexamined Patent Application Publication No. 2007-074698 is not sufficient. Furthermore, when the acoustic wave resonator is divided into a plurality of pieces, the acoustic wave filter increases in size, and the multiplexer increases in size.

SUMMARY OF THE INVENTION

Preferred embodiments of the present invention provide multiplexers in each of which a plurality of filters are connected to a common terminal, so as to provide multiplexers, high-frequency front-end circuits, and communication devices that are each small in size, and in each of which deterioration in bandpass characteristics of the plurality of filters is reduced or prevented while reducing or preventing intermodulation distortion.

A multiplexer according to a preferred embodiment of the present invention includes a common terminal, a first input and output terminal, and a second input and output terminal; a first filter connected to the common terminal and the first input and output terminal; and a second filter connected to the common terminal and the second input and output terminal and having a pass band that is different from a pass band of the first filter, in which the first filter includes one or more serial arm resonators provided on a path connecting the common terminal and the first input and output terminal, and one or more parallel arm resonators provided between the path and a ground, each of the one or more serial arm resonators and the one or more parallel arm resonators is an acoustic wave resonator including an IDT (InterDigital Transducer) electrode provided on a substrate having piezoelectricity, the IDT electrode includes a plurality of electrode fingers in parallel or substantially in parallel to one another, and in the IDT electrode included in at least one of a first serial arm resonator connected closest to the common terminal among the one or more serial arm resonators and a first parallel arm resonator connected closest to the common terminal among the one or more parallel arm resonators, an electrode finger pitch at a center portion in an arrangement direction of the plurality of electrode fingers is maximum among electrode finger pitches of the IDT electrode, and electrode finger pitches at end portions in the arrangement direction are minimum among electrode finger pitches of the IDT electrode.

In the multiplexer in which the first filter and the second filter are connected to the common terminal, due to the nonlinearity of the first filter, by a nonlinear response of a signal component of the pass band of the first filter and the disturbance wave component input through the common terminal, it is assumed that an IMD component having a frequency equal or substantially equal to that of the pass band of the second filter propagates in the second filter, and bandpass characteristics of the second filter deteriorate.

In the above configuration, in at least one of the first serial arm resonator and the first parallel arm resonator that are close to the common terminal and the second filter, the electrode finger pitch of the center portion, where the largest distortion occurs, of the IDT electrode is made large. Furthermore, the electrode finger pitch of the end portion is made small by an amount corresponding to enlarging the electrode finger pitch of the center portion. This makes it possible to reduce or prevent the distortion in the IDT electrode and improve the linearity of the first filter without changing the resonant frequency of the at least one resonator described above and without increasing the resonator in size. Accordingly, it is possible to provide a small-sized multiplexer in which occurrence of the intermodulation distortion is reduced or prevented even when the high-frequency signal input to the first filter is increased, and deterioration in the bandpass characteristics of the first filter and the second filter is reduced or prevented.

Furthermore, the one or more serial arm resonators may be a plurality of serial arm resonators, an electrode finger pitch of the IDT electrode of each of the serial arm resonators excluding the first serial arm resonator among the plurality of serial arm resonators may be uniform or substantially uniform in the arrangement direction, the one or more parallel arm resonators may be a plurality of parallel arm resonators, and an electrode finger pitch of the IDT electrode of each of the parallel arm resonators excluding the first parallel arm resonator among the plurality of parallel arm resonators may be uniform or substantially uniform in the arrangement direction.

With this configuration, the electrode finger pitch of the IDT electrode of each of the acoustic wave resonators excluding the acoustic wave resonator connected closest to the common terminal is uniform or substantially uniform, and it is thus possible to maintain a high Q value of the acoustic wave resonators. Accordingly, it is possible to effectively reduce or prevent the deterioration in the bandpass characteristics of the first filter while reducing or preventing the occurrence of the intermodulation distortion in the first filter.

Furthermore, the plurality of serial arm resonators may include three or more serial arm resonators including the first serial arm resonator, in the IDT electrode included in the first serial arm resonator, the electrode finger pitch at the center portion in the arrangement direction of the plurality of electrode fingers may be maximum among the electrode finger pitches of the IDT electrode, the electrode finger pitches at both the end portions in the arrangement direction may be minimum among the electrode finger pitches of the IDT electrode, and an average value of the electrode finger pitches of the IDT electrode of the first serial arm resonator may be equal to or more than a minimum electrode finger pitch and equal to or less than a maximum electrode finger pitch among electrode finger pitches respectively included in the three or more serial arm resonators excluding the first serial arm resonator.

According to this configuration, the average pitch of the IDT electrode of the first serial arm resonator is within a range of the electrode finger pitches of the other serial arm resonators. Accordingly, it is possible to reduce or prevent fluctuation of the resonant frequency and the anti-resonant frequency defining an attenuation pole in the pass band and in the vicinity of the pass band to such an extent that the pass band of the first filter is deteriorated, and thus it is possible to maintain the bandpass characteristics of the first filter.

Furthermore, a difference between the minimum electrode finger pitch and the maximum electrode finger pitch of the IDT electrode of the first serial arm resonator may be equal to or less than a difference between the minimum electrode finger pitch and the maximum electrode finger pitch among the electrode finger pitches respectively included in the three or more serial arm resonators excluding the first serial arm resonator.

According to this configuration, the average pitch of the IDT electrode of the first serial arm resonator is within the range of the electrode finger pitches of the other serial arm resonators, and the difference between the minimum electrode finger pitch and the maximum electrode finger pitch of the IDT electrode is equal to or less than the difference between the minimum electrode finger pitch and the maximum electrode finger pitch of the other serial arm resonators. Accordingly, since dropping of the Q value of the first serial arm resonator is able to be reduced or prevented, and it is possible to reduce insertion loss in the pass band of the first filter.

Furthermore, the one or more parallel arm resonators may include three or more parallel arm resonators including the first parallel arm resonator, in the IDT electrode included in the first parallel arm resonator, the electrode finger pitch at the center portion in the arrangement direction of the plurality of electrode fingers may be maximum among the electrode finger pitches of the IDT electrode, the electrode finger pitches at both the end portions in the arrangement direction may be minimum among the electrode finger pitches of the IDT electrode, and an average value of the electrode finger pitches of the IDT electrode of the first parallel arm resonator may be equal to or more than a minimum electrode finger pitch and equal to or less than a maximum electrode finger pitch among electrode finger pitches respectively included in the three or more parallel arm resonators excluding the first parallel arm resonator.

According to this configuration, the average pitch of the IDT electrode of the first parallel arm resonator is within a range of the electrode finger pitches of the other parallel arm resonators. Accordingly, it is possible to reduce or prevent fluctuation of the resonant frequency and the anti-resonant frequency defining an attenuation pole in the pass band and in the vicinity of the pass band to such an extent that the pass band of the first filter is deteriorated, and thus it is possible to maintain the bandpass characteristics of the first filter.

Furthermore, a difference between the minimum electrode finger pitch and the maximum electrode finger pitch of the IDT electrode of the first parallel arm resonator may be equal to or less than a difference between the minimum electrode finger pitch and the maximum electrode finger pitch among the electrode finger pitches respectively included in the three or more parallel arm resonators excluding the first parallel arm resonator.

According to this configuration, the average pitch of the IDT electrode of the first parallel arm resonator is within the range of the electrode finger pitches of the other parallel arm resonators, and the difference between the minimum electrode finger pitch and the maximum electrode finger pitch of the IDT electrode is equal to or less than the difference between the minimum electrode finger pitch and the maximum electrode finger pitch of the other parallel arm resonators. Accordingly, since dropping of the Q value of the first parallel arm resonator is able to be reduced or prevented, and it is possible to reduce insertion loss in the pass band of the first filter.

Furthermore, in the IDT electrode included in the at least one of the first serial arm resonator connected closest to the common terminal among the one or more serial arm resonators and the first parallel arm resonator connected closest to the common terminal among the one or more parallel arm resonators, the electrode finger pitch may be continuously decreased from the center portion toward the end portions in the arrangement direction.

According to the above configuration, since the electrode finger pitch between adjacent electrode fingers is varied in the arrangement direction in a gradual and smooth manner, it is possible to reduce or minimize propagation loss of the at least one acoustic wave resonator.

Furthermore, the IDT electrode may include a plurality of electrode finger regions defined by three or more adjacent electrode fingers in the arrangement direction, each of the plurality of electrode finger regions may have a uniform electrode finger pitch, and the electrode finger pitches may be reduced from an electrode finger region in a center portion of the IDT electrode toward electrode finger regions in end portions.

According to the above configuration, since distribution of the electrode finger pitch to alleviate intensity distribution of the distortion is achieved, it is possible to effectively improve the linearity of the first filter.

Furthermore, the first filter may have a ladder filter structure.

With this configuration, even if the high-frequency signal with high electric power is input to the first filter, while ensuring the low loss property thereof, deterioration in the bandpass characteristics of the second filter is able to be reduced or prevented.

Furthermore, the substrate may include a piezoelectric film on one surface of which the IDT electrode is provided, a high acoustic velocity support substrate in which a propagating bulk wave acoustic velocity is higher than an acoustic wave acoustic velocity propagating in the piezoelectric film, and a low acoustic velocity film which is arranged between the high acoustic velocity support substrate and the piezoelectric film and in which a propagating bulk wave acoustic velocity is lower than a bulk wave acoustic velocity propagating in the piezoelectric film.

With this configuration, the Q value of each acoustic wave resonator including the IDT electrode provided on the substrate including the piezoelectric layer is able to be maintained at a high value.

Furthermore, the first filter may be a transmission-side filter having a portion in a predetermined frequency band as a transmission band, and the second filter may be a reception-side filter having another portion in the predetermined frequency band as a reception band.

With this configuration, in the multiplexer including a duplexer defined by the first filter and the second filter, even when the transmission power of the transmission-side filter increases, the occurrence of intermodulation distortion is reduced or prevented, and it is possible to provide a small-sized multiplexer in which deterioration in reception sensitivity of the reception-side filter is reduced or prevented.

Furthermore, a high-frequency front-end circuit according to a preferred embodiment of the present invention includes a multiplexer according to a preferred embodiment of the present invention; and an amplification circuit connected to the multiplexer.

This makes it possible to provide a small-sized high-frequency front-end circuit in which the occurrence of the intermodulation distortion is reduced or prevented even when the high-frequency signal input to the first filter is increased, and the deterioration in the bandpass characteristics of the first filter and the second filter is reduced or prevented.

Furthermore, a communication device according to a preferred embodiment of the present invention includes an RF signal processing circuit that processes a high-frequency signal transmitted and received through an antenna element; and a high-frequency front-end circuit according to a preferred embodiment of the present invention that transmits the high-frequency signal between the antenna element and the RF signal processing circuit.

This makes it possible to provide a small-sized communication device in which the occurrence of the intermodulation distortion is reduced or prevented even when the high-frequency signal input to the first filter is increased, and the deterioration in the bandpass characteristics of the first filter and the second filter is reduced or prevented.

According to preferred embodiments of the present invention, in multiplexers in each of which a plurality of filters are connected to a common terminal, multiplexers, high-frequency front-end circuits, and communication devices that are each small in size are able to be provided, in which deterioration in bandpass characteristics of the plurality of filters is reduced or prevented while reducing or preventing intermodulation distortion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
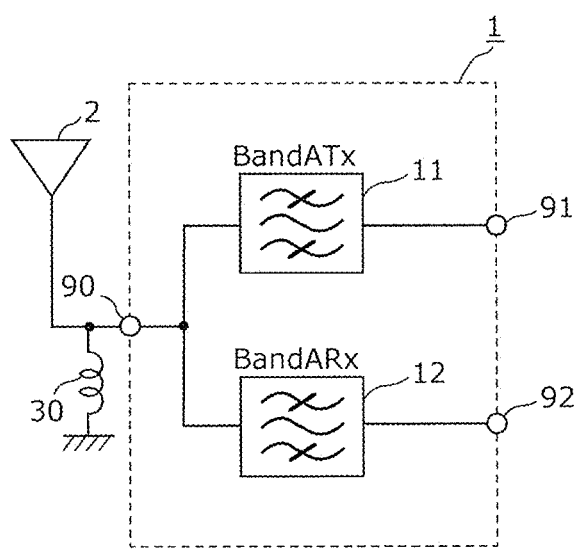
FIG. 1 is a diagram of a multiplexer according to a first preferred embodiment of the present invention and a peripheral circuit thereof.

Hereinafter, preferred embodiments of the present invention will be described in detail with reference to examples of preferred embodiments and the drawings. Note that all preferred embodiments described below indicate comprehensive or specific examples. Numerical values, shapes, materials, elements, arrangement and connection configurations of the elements, and the like, which will be described in the following preferred embodiments, are examples, and are not intended to limit the present invention. Elements which are not described in independent claims among the elements in the following preferred embodiments are described as arbitrary or optional elements. In addition, sizes or size ratios of the elements illustrated in the drawings are not necessarily strict.

First Preferred Embodiment

1. Basic Configuration of Multiplexer

FIG. 1 is a diagram of a multiplexer 1 according to a first preferred embodiment of the present invention and a peripheral circuit thereof. As illustrated in FIG. 1, the multiplexer 1 includes a transmission-side filter 11, a reception-side filter 12, a common terminal 90, a transmission input terminal 91, and a reception output terminal 92. The multiplexer 1 is connected to an antenna element 2 at the common terminal 90. An inductance element 30 providing impedance matching is connected between a connection path between the common terminal 90 and the antenna element 2 and a ground defining and functioning as a reference terminal. Note that the inductance element 30 may be connected in series between the common terminal 90 and the antenna element 2. Furthermore, the multiplexer 1 may have a configuration in which the inductance element 30 is not included. Furthermore, the configuration may be such that the inductance element 30 is included in the multiplexer 1, or is externally attached to the multiplexer 1.

The transmission-side filter 11 is a first filter that is connected to the common terminal 90 and the transmission input terminal 91 (first input and output terminal), receives a transmission wave generated by a transmission circuit (RFIC or the like, for example) and input thereto through the transmission input terminal 91, and filters the transmission wave with a transmission pass band of Band A and outputs the result to the common terminal 90. The transmission-side filter 11 is preferably, for example, a surface acoustic wave filter including an acoustic wave resonator, and includes one or more serial arm resonators provided on a path connecting the common terminal 90 and the transmission input terminal 91, and one or more parallel arm resonators provided between the path and the ground.

The reception-side filter 12 is a second filter that is connected to the common terminal 90 and the reception output terminal 92, receives a reception wave input thereto from the common terminal 90, and filters the reception wave with a reception pass band of Band A and outputs the result to the reception output terminal 92. The configuration of the reception-side filter 12 is not particularly limited and may be, for example, an acoustic wave filter, or may be an LC filter including an inductance element and a capacitance element.

Note that at least one of an inductance element and a capacitance element providing impedance matching may be connected between the common terminal 90 and each of the above-described filters.

Hereinafter, the structure of the acoustic wave resonator of the transmission-side filter 11 will be described.

2. Structure of Acoustic Wave Resonator

Figure 2A:
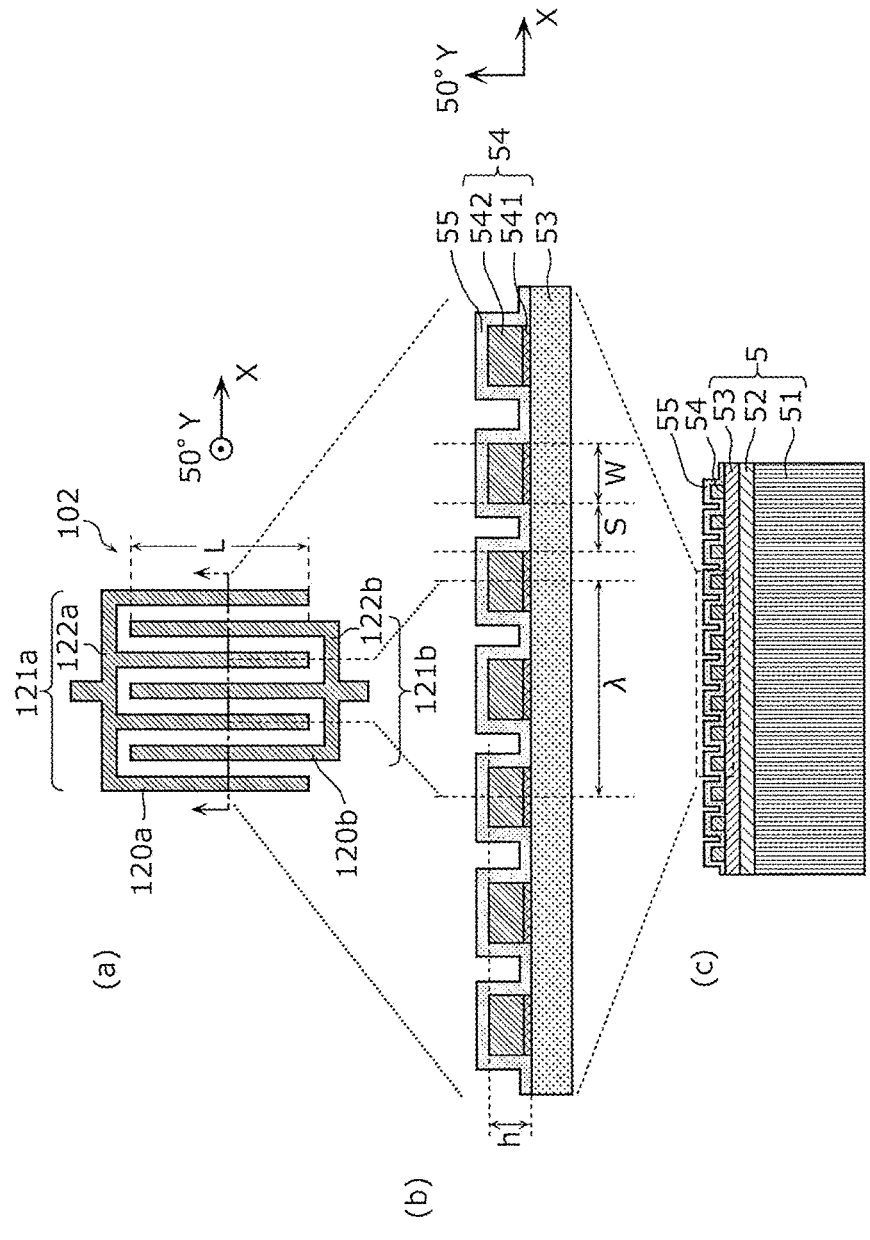
FIG. 2A illustrates a plan view and cross-sectional views schematically illustrating an example of an acoustic wave resonator according to the first preferred embodiment of the present invention.

FIG. 2A is a schematic view schematically illustrating an example of the acoustic wave resonator according to the present preferred embodiment, and part (a) is a plan view, and parts(b) and (c) are cross-sectional views taken along the dot-dash line illustrated in (a). FIG. 2A illustrates, as examples, a schematic plan view and schematic cross-sectional views each illustrating the structure of a serial arm resonator 102 among one or more serial arm resonators and one or more parallel arm resonators of the transmission-side filter 11. Note that the serial arm resonator 102 in FIG. 2A is illustrated to describe the typical structure of serial arm resonators 101 to 104, and the number, the length, the electrode finger pitch, and the like of electrode fingers of an electrode are not limited to those illustrated in FIG. 2A.

The serial arm resonator 102 includes a substrate 5 having piezoelectricity and comb tooth-shaped electrodes 121a and 121b.

As illustrated in part (a) of FIG. 2A, the pair of comb tooth-shaped electrodes 121a and 121b facing each other are provided on the substrate 5. The comb tooth-shaped electrode 121a includes a plurality of electrode fingers 120a that are parallel or substantially parallel to one another and a busbar electrode 122a that connects the plurality of electrode fingers 120a to one another. Furthermore, the comb tooth-shaped electrode 121b includes a plurality of electrode fingers 120b that are parallel or substantially parallel to one another and a busbar electrode 122b that connects the plurality of electrode fingers 120b to one another. The plurality of electrode fingers 120a and 120b extend along a direction orthogonal or substantially orthogonal to an acoustic wave propagation direction (X-axis direction).

Furthermore, an IDT (InterDigital Transducer) electrode 54 including the plurality of electrode fingers 120a and 120b and the busbar electrodes 122a and 122b has a laminated structure including a close contact layer 541 and a main electrode layer 542 as illustrated in part (b) of FIG. 2A.

The close contact layer 541 is a layer to improve a close contact property between the substrate 5 and the main electrode layer 542, and for example, Ti is preferably used as a material. The close contact layer 541 preferably has a film thickness of, for example, about 12 nm.

For the main electrode layer 542, as a material, for example, Al including 1% of Cu is preferably used. The main electrode layer 542 preferably has a film thickness of, for example, about 162 nm.

A protective layer 55 covers the comb tooth-shaped electrodes 121a and 121b. The protective layer 55 protects the main electrode layer 542 from the external environment, adjusts frequency temperature characteristics, improves moisture resistance, and the like, and is preferably, for example, a dielectric film including silicon dioxide as a main component. The protective layer 55 preferably has a thickness of, for example, about 25 nm.

Note that the materials of which the close contact layer 541, the main electrode layer 542, and the protective layer 55 are made are not limited to the above-described materials. Furthermore, the IDT electrode 54 may not have the above-described laminated structure. The IDT electrode 54 may be made of, for example, a metal such as Ti, Al, Cu, Pt, Au, Ag, Pd, or the like, or an alloy thereof, or may include a plurality of multilayer bodies made of the metal or the alloy described above. Additionally, the protective layer 55 may not be provided.

Next, a laminated structure of the substrate 5 will be described.

As illustrated in part (c) of FIG. 2A, the substrate 5 includes a high acoustic velocity support substrate 51, a low acoustic velocity film 52, and a piezoelectric film 53, and has a structure in which the high acoustic velocity support substrate 51, the low acoustic velocity film 52, and the piezoelectric film 53 are laminated in this order.

The piezoelectric film 53 is preferably made of, for example, a 50° Y-cut X-propagation $LiTaO_3$ piezoelectric single crystal or piezoelectric ceramics (a lithium tantalate single crystal or ceramics obtained by cutting along a surface which takes, as a normal line, an axis which is rotated by about 50° from the Y-axis with an X-axis as the center axis, and a single crystal or ceramics in which a surface acoustic wave propagates in the X-axis direction). The piezoelectric film 53 preferably has, for example, a thickness of about 600 nm. Note that depending on required specifications of the respective filters, the material and the cut-angle of the piezoelectric single crystal to be used as the piezoelectric film 53 are appropriately selected.

The high acoustic velocity support substrate 51 is a substrate that supports the low acoustic velocity film 52, the piezoelectric film 53, and the IDT electrode 54. Furthermore, the high acoustic velocity support substrate 51 is a substrate in which the acoustic velocity of a bulk wave in the high acoustic velocity support substrate 51 is higher than that of an acoustic wave such as a surface acoustic wave, a boundary wave, and the like propagating in the piezoelectric film 53, and confines the surface acoustic wave in a portion where the piezoelectric film 53 and the low acoustic velocity film 52 are laminated, and prevents it from leaking below the high acoustic velocity support substrate 51. The high acoustic velocity support substrate 51 is preferably, for example, a silicon substrate, and preferably has a thickness of, for example, about 200 μm.

The low acoustic velocity film 52 is a film in which the acoustic velocity of a bulk wave in the low acoustic velocity film is lower than that of a bulk wave that propagates in the piezoelectric film 53, and is disposed between the piezoelectric film 53 and the high acoustic velocity support substrate 51. This structure and a property that the acoustic wave essentially concentrates energy in a medium having a low acoustic velocity reduce or prevent the surface acoustic wave energy from leaking to the outside of the IDT electrode. The low acoustic velocity film 52 is preferably, for example, a film including silicon dioxide as a main component, and preferably has a thickness of, for example, about 670 nm.

Note that according to the above-described laminated structure of the substrate 5, the Q value at the resonant frequency and the anti-resonant frequency can be significantly increased as compared to the existing structure in which a piezoelectric substrate of a single layer is used. That is, since an acoustic wave resonator having a high Q value can be provided, it is possible to provide a filter having a small insertion loss by using the acoustic wave resonator.

Furthermore, in order to reduce or prevent the intermodulation distortion of the transmission-side filter 11, as will be described later, when the electrode finger pitch of the serial arm resonator 101 is varied, a case is assumed in which the Q value of the serial arm resonator 101 is equivalently reduced in comparison with a serial arm resonator with a uniform or substantially uniform electrode finger pitch. However, according to the laminated structure of the substrate described above, the Q value of the serial arm resonator 101 can be maintained at a high value. Accordingly, it is possible to provide an acoustic wave filter having a low loss property in the pass band.

Note that the high acoustic velocity support substrate 51 may have a structure in which a support substrate, and a high acoustic velocity film in which the acoustic velocity of a bulk wave propagating therein is higher than that of an acoustic wave such as a surface acoustic wave, a boundary wave, and the like propagating in the piezoelectric film 53 are laminated. In this case, for the support substrate, it is possible to use, for example, a piezoelectric material such as lithium tantalate, lithium niobate, crystal, or the like, various types of ceramics including alumina, magnesia, silicon nitride, aluminum nitride, silicon carbide, zirconia, cordierite, mullite, steatite, forsterite, or the like, dielectric materials such as sapphire, glass, or the like or semiconductors such as silicon, gallium nitride, or the like, and a resin substrate, or the like. Furthermore, for the high acoustic velocity film, various high acoustic velocity materials can be used, such as, for example, aluminum nitride, aluminum oxide, silicon carbide, silicon nitride, silicon oxynitride, a DLC film, or diamond, a medium containing the above-described material as a main component, a medium containing a mixture of the above-described materials as a main component, or the like.

Figure 2B:
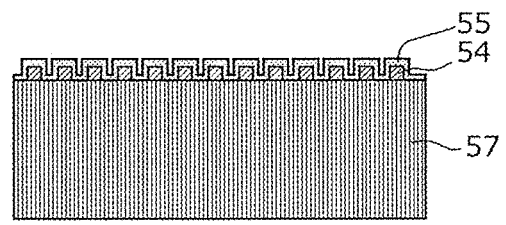
FIG. 2B is a cross-sectional view schematically illustrating an acoustic wave resonator according to a first modification of the first preferred embodiment of the present invention.

FIG. 2B is a cross-sectional view schematically illustrating an acoustic wave resonator according to a first modification of the first preferred embodiment. In the serial arm resonator 102 illustrated in FIG. 2A, an example in which the IDT electrode 54 is provided on the substrate 5 including the piezoelectric film 53 has been described, but the substrate on which the IDT electrode 54 is, as illustrated in FIG. 2B, provided may be a piezoelectric single crystal substrate 57 including a single layer of a piezoelectric layer. The piezoelectric single crystal substrate 57 is preferably made of, for example, a piezoelectric single crystal of $LiNbO_3$. The serial arm resonator 102 according to the present modification includes the piezoelectric single crystal substrate 57 of $LiNbO_3$, the IDT electrode 54, and the protective layer 55 provided on the piezoelectric single crystal substrate 57 and on the IDT electrode 54.

In the piezoelectric film 53 and the piezoelectric single crystal substrate 57 described above, the laminated structure, the material, the cut-angle, and the thickness may be appropriately changed in accordance with required bandpass characteristics and the like of the acoustic wave filter device. Even in the serial arm resonator 102 including an $LiTaO_3$ piezoelectric substrate or the like having a cut-angle other than the cut-angle described above, the same or similar advantageous effect as those of the serial arm resonator 102 using the piezoelectric film 53 described above can be obtained.

Here, an example (working example) of electrode parameters of the IDT electrode of the acoustic wave resonator will be described.

A wavelength of the acoustic wave resonator is defined by a wavelength λ which is a repetition period of the plurality of electrode fingers 120a or 120b of the IDT electrode 54 illustrated in part (b) of FIG. 2A. Furthermore, the electrode finger pitch is about ½ of the wavelength λ, and is defined as (W+S) when a line width of each of the electrode fingers 120a and 120b of the comb tooth-shaped electrodes 121a and 121b is taken as W, and a space width between the electrode finger 120a and the electrode finger 120b which are adjacent to each other is taken as S. Furthermore, an intersecting width L of the pair of comb tooth-shaped electrodes 121a and 121b is, as illustrated in part (a) of FIG. 2A, an overlapping electrode finger length when viewed from the acoustic wave propagation direction (X-axis direction) of the electrode finger 120a and the electrode finger 120b. Furthermore, an electrode duty of each acoustic wave resonator is a line width occupation ratio of the plurality of electrode fingers 120a and 120b, and is a ratio of the line width to an addition value of the line width and the space width of the plurality of electrode fingers 120a and 120b, and is defined by W/(W+S). Furthermore, the height of the comb tooth-shaped electrodes 121a and 121b, that is, the film thickness, is defined as h. Parameters for determining the shape and the size of the IDT electrode of the acoustic wave resonator, such as the wavelength λ, the intersecting width L, the electrode duty, the film thickness h of the IDT electrode 54, and the like described above, are referred to as electrode parameters.

3. Configuration of Transmission-Side Filter 11 According to First Working Example Hereinafter, the circuit configuration of the transmission-side filter 11 according to a first working example will be described with reference to FIG. 3.

Figure 3:
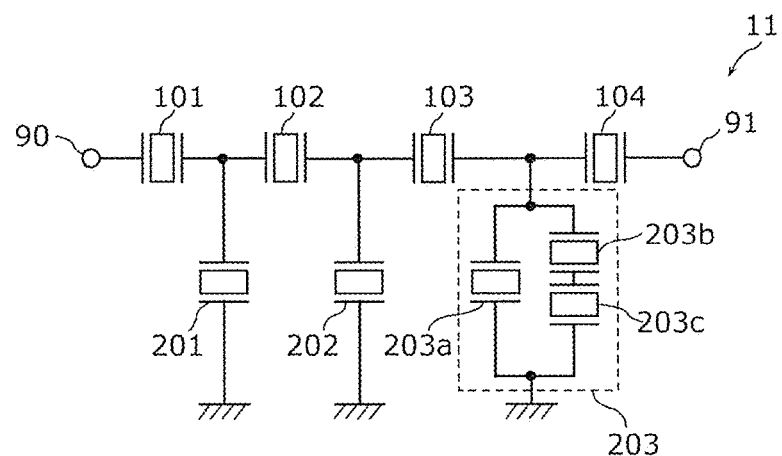
FIG. 3 is a circuit diagram of a transmission-side filter defining a multiplexer according to a first working example of a preferred embodiment of the present invention.

FIG. 3 is a circuit diagram of the transmission-side filter 11 defining the multiplexer 1 according to the first working example. The multiplexer 1 according to the first working example has a configuration in which the transmission-side filter 11 and the reception-side filter 12 are connected to the common terminal 90, in the same or similar manner as the multiplexer 1 according to the first preferred embodiment. Furthermore, the transmission-side filter 11 according to the first working example is a specific circuit example of the transmission-side filter 11 according to the first preferred embodiment.

As illustrated in FIG. 3, the transmission-side filter includes the serial arm resonators 101, 102, 103, and 104, parallel arm resonators 201 and 202, and a parallel arm circuit 203.

The serial arm resonators 101 to 104 are provided on a path connecting the common terminal 90 and the transmission input terminal 91, and are connected in series to one another. Furthermore, the parallel arm resonators 201 and 202 and the parallel arm circuit 203 are each provided between a node on the path and a reference terminal (ground). The parallel arm circuit 203 includes acoustic wave resonators 203a, 203b, and 203c, and is a circuit in which the acoustic wave resonators 203b and 203c are connected in series and the acoustic wave resonator 203a are connected in parallel. Note that as in the parallel arm circuit 203, a resonance circuit including a plurality of acoustic wave resonators and connected to the same node on the path can also be regarded as being equivalent to one parallel arm resonator. Furthermore, a circuit element such as an inductor, a capacitor, or the like, for example, may be connected to and inserted into each connection node connecting the common terminal 90, the transmission input terminal 91, the ground, the serial arm resonators 101, 102, 103, and 104, the parallel arm resonators 201 and 202, and the parallel arm circuit 203.

The transmission-side filter 11 defines a ladder band pass filter by the above-described connection configuration of the serial arm resonators 101 to 104, the parallel arm resonators 201 and 202, and the parallel arm circuit 203. Note that the number of serial arm resonators and parallel arm resonators is not limited to the above-described configuration, and it is sufficient that the acoustic wave filter includes one or more serial arm resonators and one or more parallel arm resonators.

4. Configuration of IDT Electrode of First Working Example

In the multiplexer 1 including the transmission-side filter 11, due to the nonlinearity of the transmission-side filter 11, by a nonlinear response of a signal component of a transmission band of the transmission-side filter 11 and a disturbance wave component input through the common terminal 90, it is assumed that an intermodulation distortion (IMD) component having a frequency equal or substantially equal to that of a reception band of the reception-side filter 12 propagates in the reception-side filter 12. As a result, the reception sensitivity that is the bandpass characteristics of the reception-side filter 12 deteriorates. In addition, although the IMD component may be generated in all of the acoustic wave resonators defining the transmission-side filter 11, the acoustic wave resonator that applies the largest IMD component to the reception-side filter 12 is the serial arm resonator 101 connected closest to the common terminal 90.

From this viewpoint, in the transmission-side filter 11 according to the present working example, in order to reduce the IMD component propagating in the reception-side filter 12, the electrode finger pitch of the IDT electrode is varied in the serial arm resonator 101 connected closest to the common terminal 90 and the reception-side filter 12 among the acoustic wave resonators constituting the transmission-side filter 11.

Figure 4:
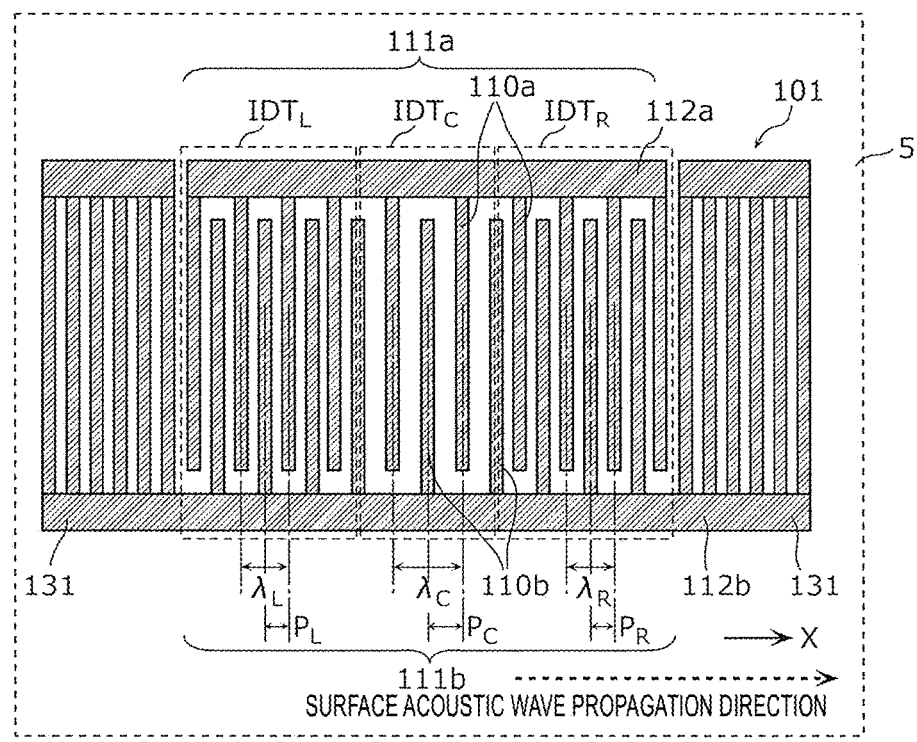
FIG. 4 is a schematic plan view illustrating an electrode configuration of an initial stage-side acoustic wave resonator of the transmission-side filter according to the first working example.

FIG. 4 is a schematic plan view illustrating an electrode configuration of the serial arm resonator 101 of the transmission-side filter 11 according to the first working example. FIG. 4 shows, as an example, a schematic plan view illustrating an IDT electrode structure of the serial arm resonator 101 connected closest to the common terminal 90. Note that the serial arm resonator 101 in FIG. 4 is illustrated to describe the typical structure of the acoustic wave resonator (initial stage acoustic wave resonator) connected closest to the common terminal 90, and the number, the length, and the like of electrode fingers of the electrode are not limited to those in the diagram.

The serial arm resonator 101 includes the substrate 5 having piezoelectricity, comb tooth-shaped electrodes 111a and 111b provided on the substrate 5, and reflectors 131.

As illustrated in FIG. 4, the comb tooth-shaped electrode 111a includes a plurality of electrode fingers 110a that are parallel or substantially parallel to one another and a busbar electrode 112a that connects the plurality of electrode fingers 110a to one another. Furthermore, the comb tooth-shaped electrode 111b includes a plurality of electrode fingers 110b that are parallel or substantially parallel to one another and a busbar electrode 112b that connects the plurality of electrode fingers 110b to one another. The plurality of electrode fingers 110a and 110b extend along a direction orthogonal or substantially orthogonal to an acoustic wave propagation direction (X-axis direction). The comb tooth-shaped electrodes 111a and 111b face each other such that the plurality of electrode fingers 110a and the plurality of electrode fingers 110b interdigitate with each other.

Note that the IDT electrode includes the plurality of electrode fingers 110a and 110b and the busbar electrodes 112a and 112b has a laminated structure including the close contact layer 541 and the main electrode layer 542 as illustrated in part (b) of FIG. 2A.

The reflectors 131 each include a plurality of electrode fingers parallel or substantially parallel to one another and a busbar electrode that connects the plurality of electrode fingers, and are respectively disposed at both ends of the comb tooth-shaped electrodes 111a and 111b in the acoustic wave propagation direction.

Note that the comb tooth-shaped electrode 111a may include a dummy electrode arranged so as to face in the lengthwise direction of the plurality of electrode fingers 110b. Additionally, the comb tooth-shaped electrode 111b may include a dummy electrode arranged so as to face in the lengthwise direction of the plurality of electrode fingers 110a. In addition, the IDT electrode illustrated in FIG. 4 may include a thinned-out electrode, and may be an inclined type IDT electrode in which a straight line connecting tip ends of the plurality of electrode fingers 110a to one another and a straight line connecting tip ends of the plurality of electrode fingers 110b to one another are inclined with respect to the propagation direction of the acoustic wave.

Here, in the IDT electrode of the serial arm resonator 101, an electrode finger pitch $P_C$ at the center portion in the arrangement direction of the plurality of electrode fingers (the X positive direction and the X negative direction in FIG. 4) is maximum among the electrode finger pitches of the IDT electrode, and electrode finger pitches $P_L$ and $P_R$ at the end portions in the arrangement direction are minimum among the electrode finger pitches of the IDT electrode.

In order to reduce the IMD component of the acoustic wave resonator, it is necessary to improve linearity of an output signal with respect to an input signal. In order to improve the linearity of the acoustic wave resonator, it is effective to reduce a normalized film thickness h/λ using the film thickness h and the wavelength λ of the IDT electrode as parameters. That is, the linearity of the acoustic wave resonator can be improved by reducing the film thickness h or by increasing the wavelength λ. It is undesirable to reduce the film thickness h of a predetermined acoustic wave resonator from the viewpoint of simplifying a manufacturing process. On the other hand, although the acoustic wave resonators can be made to be individually compliant with a method to increase the wavelength λ, the resonant frequency decreases.

Accordingly, in the transmission-side filter 11 according to the present working example, in the IDT electrode of the serial arm resonator 101, the electrode finger pitch at the center portion of the IDT electrode having the maximum power density and the maximum distortion of the substrate and the electrode fingers when a high-frequency signal is applied is made large, and the electrode finger pitches at the end portions are made small by an amount corresponding to enlarging the electrode finger pitch of the center portion. This makes it possible to reduce or prevent the distortion in the IDT electrode and improve the linearity of the transmission-side filter 11 without changing the resonant frequency of the serial arm resonator 101 and without increasing the size of the serial arm resonator 101 due to division or the like. Accordingly, it is possible to provide the multiplexer 1 reduced in size in which the occurrence of the IMD is reduced or prevented even when the high-frequency signal input to the transmission-side filter 11 is increased, and the deterioration in the bandpass characteristics of the transmission-side filter 11 and the reception-side filter 12 is reduced or prevented.

Figure 5A:
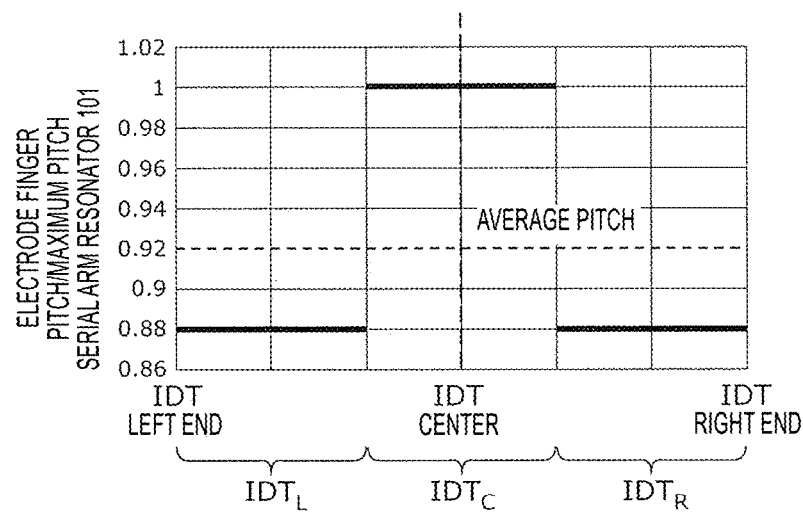
FIG. 5A is a graph showing distribution of electrode finger pitch of the initial stage-side acoustic wave resonator of the transmission-side filter according to the first working example.

FIG. 5A is a graph showing distribution of electrode finger pitch of the serial arm resonator 101 of the transmission-side filter 11 according to the first working example. In the graph, the horizontal axis represents a position of the electrode finger in the arrangement direction of the plurality of electrode fingers, and the vertical axis represents the electrode finger pitch normalized by the maximum electrode finger pitch. The distribution of the electrode finger pitch shown in FIG. 5A corresponds to the IDT electrode structure illustrated in FIG. 4.

That is, the IDT electrode of the serial arm resonator 101 includes electrode finger regions $IDT_L$, $IDT_C$, and $IDT_R$ each including three or more adjacent electrode fingers in the above-described arrangement direction. The electrode finger pitch $P_C$ in the electrode finger region $IDT_C$ is uniform or substantially uniform, the electrode finger pitch $P_L$ in the electrode finger region $IDT_L$ is uniform or substantially uniform, and the electrode finger pitch $P_R$ in the electrode finger region $IDT_R$ is uniform or substantially uniform. The electrode finger pitch $P_C$ of the electrode finger region $IDT_C$ in the center portion is maximum, and the electrode finger pitches of the electrode finger region $IDT_L$ and the electrode finger region $IDT_R$ in both end portions are minimum. In addition, in the present working example, the electrode finger pitches $P_L$ and $P_R$ are each about 0.88 times, for example, the electrode finger pitch $P_C$.

Figure 5B:
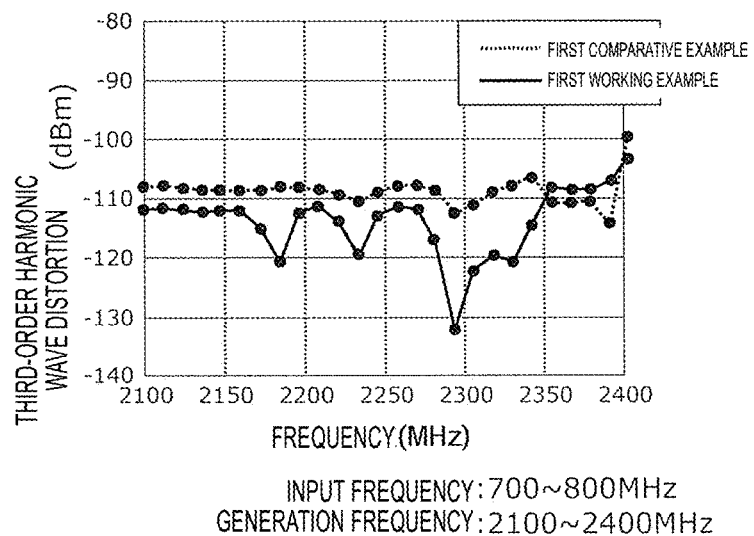
FIG. 5B is a graph showing a comparison between generation amounts of third-order harmonic wave distortion in the initial stage-side acoustic wave resonator of the transmission-side filter according to each of the first working example and a first comparative example.

FIG. 5B is a graph showing a comparison between generation amounts of third-order harmonic wave distortion in the serial arm resonator 101 (initial stage acoustic wave resonator) of the transmission-side filter 11 according to each of the first working example and a first comparative example. The graph shows a frequency dependence of the third-order harmonic wave distortion (about 2100 MHz to about 2400 MHz, for example) that occurs when a high-frequency signal (about 700 MHz to about 800 MHz, for example) is input to the serial arm resonator 101.

Note that the acoustic wave resonator according to the first comparative example is a resonator in which the electrode finger pitch of the IDT electrode is not varied and is made uniform or substantially uniform in contrast to the serial arm resonator 101 according to the first working example, and the electrode finger pitch of the acoustic wave resonator is equivalent or substantially equivalent to an average electrode finger pitch of the serial arm resonator 101 according to the first working example.

As shown in FIG. 5B, over the entire frequency band of the third-order harmonic wave, the serial arm resonator 101 according to the first working example has a smaller generation amount of the third-order harmonic wave distortion than that of the acoustic wave resonator according to the first comparative example. That is, as in the serial arm resonator 101 according to the first working example, by maximizing the electrode finger pitch at the center portion in the arrangement direction of the plurality of electrode fingers among the electrode finger pitches of the IDT electrode, and by minimizing the electrode finger pitches at the end portions in the arrangement direction among the electrode finger pitches of the IDT electrode, it is possible to reduce or prevent the generation amount of the intermodulation distortion.

Figure 6A:
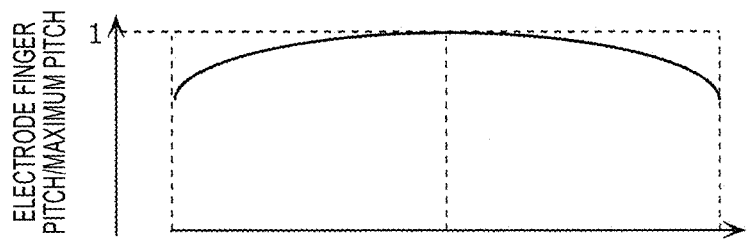
FIGS. 6A to 6C are graphs showing an example of distribution of electrode finger pitch of the initial stage-side acoustic wave resonator of the transmission-side filter according to the first preferred embodiment of the present invention.
Figure 6B:
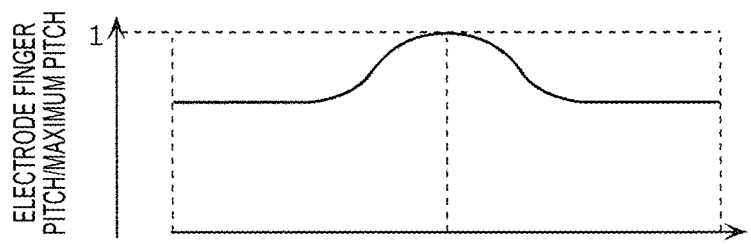
Figure 6C:
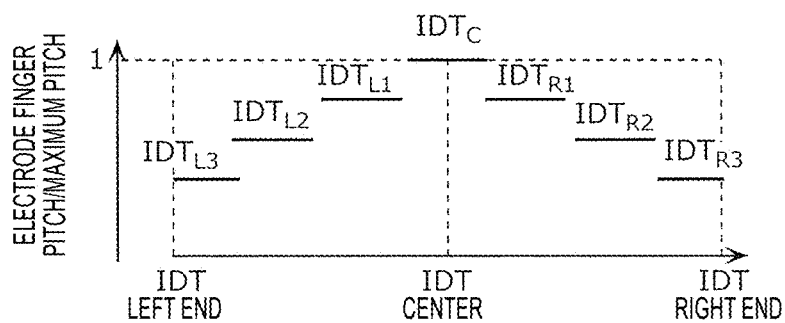

FIGS. 6A to 6C are graphs showing an example of distribution of electrode finger pitch of the serial arm resonator 101 of the transmission-side filter 11 according to the first preferred embodiment.

FIGS. 6A and 6B show, for the IDT electrode of the serial arm resonator 101, an electrode finger distribution in which the electrode finger pitch continuously decreases from the center portion toward the end portions in the arrangement direction. FIG. 6A shows distribution in which the difference between the entire electrode finger pitch and the maximum electrode finger pitch in the center portion is made as small as possible, and the distribution is such that the maximum electrode finger pitch in the center portion is not protruded. In contrast, in FIG. 6B, the electrode finger pitch is enlarged only in the center portion, and the electrode finger pitch in a portion other than the center portion is made as uniform as possible.

On the other hand, the distribution in FIG. 6C is applied to the distribution illustrated in FIG. 4 and FIG. 5A. That is, the IDT electrode includes electrode finger regions ($IDT_C$, $IDT_{L1}$, $IDT_{L2}$, $IDT_{L3}$, $IDT_{R1}$, $IDT_{R2}$, and $IDT_{R3}$) including three or more adjacent electrode fingers in the arrangement direction. One electrode finger region has an equal or substantially equal electrode finger pitch, and the electrode finger pitch decreases from the electrode finger region $IDT_C$ in the center portion toward the electrode finger regions $IDT_{L3}$ and $IDT_{R3}$ in the end portions of the IDT electrode.

In any electrode finger distribution in FIGS. 6A to 6C, the electrode finger pitch at the center portion of the IDT electrode having the maximum power density and the maximum distortion of the substrate and the electrode fingers when a high-frequency signal is applied to the IDT electrode is made large, and the electrode finger pitches at the end portions are made small by an amount corresponding to enlarging the electrode finger pitch of the center portion. This makes it possible to reduce or prevent the distortion in the IDT electrode and improve the linearity of the transmission-side filter 11 without changing the resonant frequency of the serial arm resonator 101 and without increasing the size of the serial arm resonator 101 due to division or the like.

Note that in the transmission-side filter 11 according to the first working example, it is preferable that the IDT electrode of the serial arm resonator 102 have an equal or substantially equal electrode finger pitch in the arrangement direction, the IDT electrode of the serial arm resonator 103 have an equal or substantially equal electrode finger pitch in the arrangement direction, and the IDT electrode of the serial arm resonator 104 have an equal or substantially equal electrode finger pitch in the arrangement direction. Furthermore, it is preferable that the parallel arm resonator 201 have an equal or substantially equal electrode finger pitch in the arrangement direction, the parallel arm resonator 202 have an equal or substantially equal electrode finger pitch in the arrangement direction, and each of the acoustic wave resonators of the parallel arm circuit 203 have an equal or substantially equal electrode finger pitch in the arrangement direction. That is, it is preferable that the IDT electrode of each of the resonators excluding the serial arm resonator 101 have an equal or substantially equal electrode finger pitch in the arrangement direction. In the acoustic wave resonator including the IDT electrode, the Q value of the acoustic wave resonator increases when the electrode finger pitch is uniform or substantially uniform, and the Q value decreases as the electrode finger pitch varies. With this configuration, since the electrode finger pitch of the IDT electrode of each of the resonators excluding the serial arm resonator 101 connected closest to the common terminal 90 is uniform or substantially uniform, it is possible to maintain the high Q value of the resonators. Accordingly, it is possible to effectively reduce or prevent the deterioration in insertion loss that is the bandpass characteristics of the transmission-side filter 11 while reducing or preventing the occurrence of the intermodulation distortion in the transmission-side filter 11.

Note that the transmission-side filter 11 according to the present working example may be an acoustic wave filter including the serial arm resonator 101 and the parallel arm resonator 201, and a longitudinally coupled resonator. In this case, in the IDT electrode of the serial arm resonator 101, the electrode finger pitch $P_C$ at the center portion in the arrangement direction of the plurality of electrode fingers is maximum among the electrode finger pitches of the IDT electrode, and the electrode finger pitches $P_L$ and $P_R$ at the end portions in the arrangement direction are minimum among the electrode finger pitches of the IDT electrode. In addition, in the plurality of IDT electrodes of the longitudinally coupled resonator, the electrode finger pitch may not be uniform in the above-described arrangement direction.

5. Configuration of Transmission-Side Filter 13 According to Second Working Example and Third Working Example Hereinafter, the circuit configuration of the transmission-side filter 11 according to a second working example and a third working example will be described with reference to FIG. 7.

Figure 7:
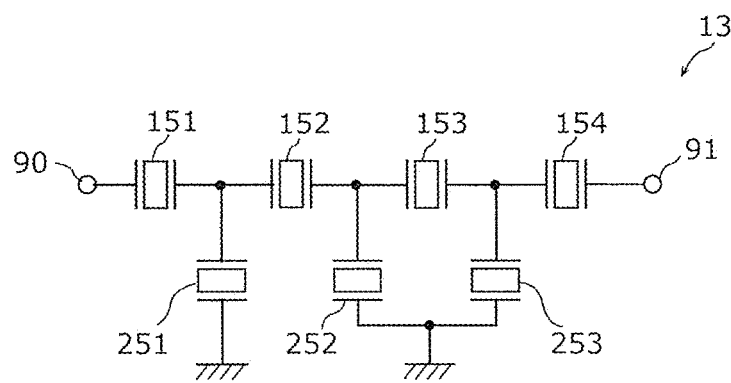
FIG. 7 is a circuit diagram of a transmission-side filter defining a multiplexer according to second and third working examples of a preferred embodiment of the present invention.

FIG. 7 is a circuit diagram of a transmission-side filter 13 defining a multiplexer according to each of the second working example and the third working example. The multiplexer according to each of the second working example and the third working example has a configuration in which the transmission-side filter 13 and the reception-side filter 12 are connected to the common terminal 90. Furthermore, the transmission-side filter 13 according to each of the second working example and the third working example is a specific circuit configuration example of the transmission-side filter 11 according to the first preferred embodiment.

As illustrated in FIG. 7, the transmission-side filter includes serial arm resonators 151, 152, 153, and 154, and parallel arm resonators 251, 252, and 253.

The serial arm resonators 151 to 154 are provided on a path connecting the common terminal 90 and the transmission input terminal 91, and are connected in series to one another. Furthermore, the parallel arm resonators 251 to 253 are each provided between a node on the path and the reference terminal (ground). The parallel arm resonators 252 and 253 are connected to a common ground. Note that a circuit element such as an inductor, a capacitor, or the like, for example, may be connected to and inserted into each connection node connecting the common terminal 90, the transmission input terminal 91, the ground, the serial arm resonators 151, 152, 153, and 154, and the parallel arm resonators 251, 252, and 253.

The transmission-side filter 13 defines a ladder band pass filter by the above-described connection configuration of the serial arm resonators 151 to 154 and the parallel arm resonators 251 to 253. Note that the numbers of the serial arm resonators and the parallel arm resonators are not limited to the above-described configuration.

6. Configuration of IDT Electrode of Second Working Example and Third Working Example In the multiplexer including the transmission-side filter 13, by a nonlinear response of a harmonic wave distortion component of the transmission-side filter 13 due to the nonlinearity of the transmission-side filter 13 and a disturbance wave component input through the common terminal 90, it is assumed that an IMD component having a frequency included in a reception band of the reception-side filter 12 propagates in the reception-side filter 12. As a result, the reception sensitivity that is the bandpass characteristics of the reception-side filter 12 deteriorates. In addition, although the IMD component may be generated in all of the acoustic wave resonators defining the transmission-side filter 13, the acoustic wave resonator that applies the largest IMD component to the reception-side filter 12 is the serial arm resonator 151 connected closest to the common terminal 90.

From this viewpoint, in the transmission-side filter 13 according to each of the present working examples, in order to reduce the IMD component propagating in the reception-side filter 12, the electrode finger pitch of the IDT electrode is varied in the serial arm resonator 151 connected closest to the common terminal 90 and the reception-side filter 12 among the acoustic wave resonators defining the transmission-side filter 13.

Here, in the IDT electrode of the serial arm resonator 151, the electrode finger pitch $P_C$ at the center portion in the arrangement direction of the plurality of electrode fingers is maximum among the electrode finger pitches of the IDT electrode, and the electrode finger pitches $P_L$ and $P_R$ at the end portions in the arrangement direction are minimum among the electrode finger pitches of the IDT electrode.

Table 1 shows the electrode finger pitches of the serial arm resonator 151 according to each of the second working example, the third working example, and a second comparative example.

TABLE 1

| TRANSMISSION-SIDE FILTER 13 | SECOND WORKING EXAMPLE | THIRD WORKING EXAMPLE | SECOND COMPARATIVE EXAMPLE |
|---|---|---|---|
| SERIAL ARM RESONATOR 151 ELECTRODE FINGER PITCH (μm) | 2.747 to 2.803 | 2.761 to 2.788 | 2.775 |
| SERIAL ARM RESONATOR 152 ELECTRODE FINGER PITCH (μm) | 2.804 | 2.804 | 2.804 |
| SERIAL ARM RESONATOR 153 ELECTRODE FINGER PITCH (μm) | 2.732 | 2.732 | 2.732 |
| SERIAL ARM RESONATOR 154 ELECTRODE FINGER PITCH (μm) | 2.779 | 2.779 | 2.779 |

Figure 8A:
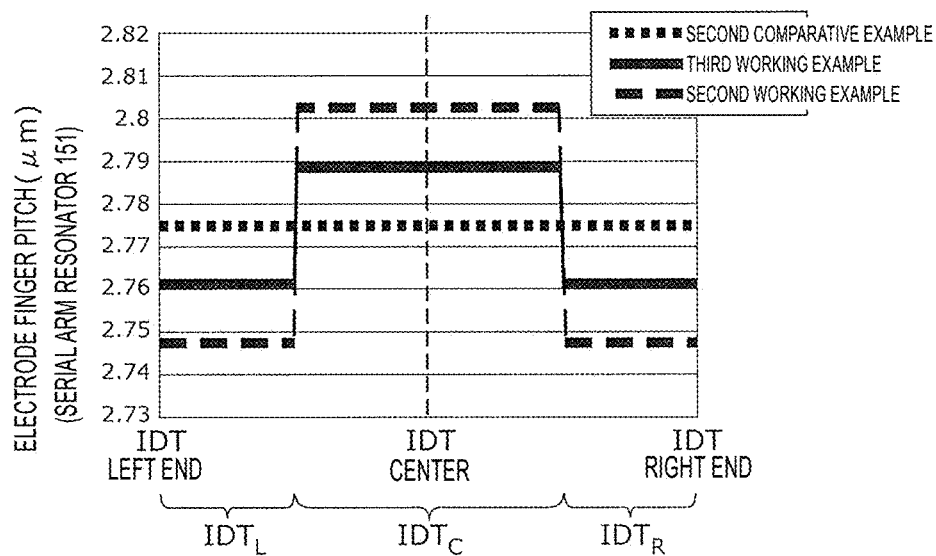
FIG. 8A is a graph showing distribution of electrode finger pitch of an initial stage-side acoustic wave resonator of the transmission-side filter according to each of the second working example, the third working example, and a second comparative example.

FIG. 8A is a graph showing distribution of electrode finger pitch of the serial arm resonator 151 of the transmission-side filter 13 according to each of the second working example, the third working example, and the second comparative example. In the graph, the horizontal axis represents a position of the electrode finger in the arrangement direction of the plurality of electrode fingers, and the vertical axis represents the electrode finger pitch.

The IDT electrode of the serial arm resonator 151 of the transmission-side filter 13 according to each of the second working example and the third working example includes electrode finger regions $IDT_L$, $IDT_C$, and $IDT_R$ including three or more adjacent electrode fingers in the above-described arrangement direction. The electrode finger pitch $P_C$ in the electrode finger region $IDT_C$ is uniform or substantially uniform, the electrode finger pitch $P_L$ in the electrode finger region $IDT_L$ is uniform or substantially uniform, and the electrode finger pitch $P_R$ in the electrode finger region $IDT_R$ is uniform or substantially uniform. The electrode finger pitch $P_C$ of the electrode finger region $IDT_C$ in the center portion is maximum, and the electrode finger pitches of the electrode finger region $IDT_L$ and the electrode finger region $IDT_R$ in both end portions are minimum.

In the second working example, in the IDT electrode of the serial arm resonator 151, the electrode finger pitch $P_C$ of the electrode finger region $IDT_C$ in the center portion is about 2.803 μm, and the electrode finger pitches $P_L$ and $P_R$ of the electrode finger regions $IDT_L$ and $IDT_R$ in both end portions are each about 2.747 μm, for example.

In the third working example, in the IDT electrode of the serial arm resonator 151, the electrode finger pitch $P_C$ of the electrode finger region $IDT_C$ in the center portion is about 2.788 μm, and the electrode finger pitches $P_L$ and $P_R$ of the electrode finger regions $IDT_L$ and $IDT_R$ in both end portions are each about 2.761 μm, for example.

In the second comparative example, in the IDT electrode of the serial arm resonator 151, the electrode finger pitch is uniform, and is about 2.775 μm, for example.

Figure 8B:
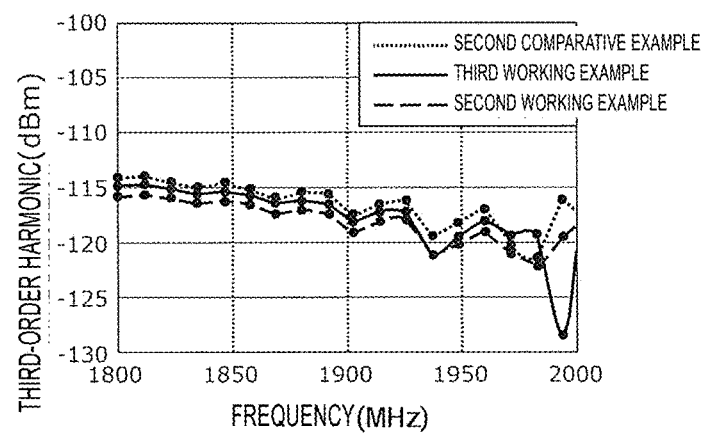
FIG. 8B is a graph showing a comparison among generation amounts of third-order harmonic wave distortion in the initial stage-side acoustic wave resonator of the transmission-side filter according to each of the second working example, the third working example, and the second comparative example.

FIG. 8B is a graph showing a comparison among generation amounts of third-order harmonic wave distortion in the serial arm resonator 151 of the transmission-side filter 13 according to each of the second working example, the third working example, and the second comparative example. The graph shows a frequency dependence of the third-order harmonic wave distortion (about 1800 MHz to about 2010 MHz, for example) that occurs when a high-frequency signal (about 600 MHz to about 670 MHz, for example) is input to the serial arm resonator 151.

As shown in FIG. 8B, over the entire frequency band of the third-order harmonic wave, the serial arm resonator 151 according to each of the second working example and the third working example has a smaller generation amount of the third-order harmonic wave distortion than that of the acoustic wave resonator according to the second comparative example. That is, as in the serial arm resonator 151 according to each of the second working example and the third working example, by maximizing the electrode finger pitch at the center portion in the arrangement direction of the plurality of electrode fingers among the electrode finger pitches of the IDT electrode, and by minimizing the electrode finger pitches at the end portions in the arrangement direction among the electrode finger pitches of the IDT electrode, it is possible to reduce or prevent the generation amount of the intermodulation distortion.

Furthermore, the serial arm resonator 151 according to the second working example has a smaller generation amount of the third-order harmonic wave distortion than that of the serial arm resonator 151 according to the third working example. That is, the larger the variation amount in the electrode finger pitch (difference between the maximum value and the minimum value) in the serial arm resonator 151 is, the more the generation amount of the intermodulation distortion can be reduced or prevented.

Here, in the second working example, the average value of the electrode finger pitches (about 2.747 μm to about 2.803 μm, for example) of the IDT electrode of the serial arm resonator 151 is equal to or more than the minimum electrode finger pitch (the electrode finger pitch of the serial arm resonator 153: about 2.732 μm, for example) and is equal to or less than the maximum electrode finger pitch (the electrode finger pitch of the serial arm resonator 152: about 2.804 μm, for example), among the electrode finger pitches respectively included in the three serial arm resonators 152 to 154 excluding the serial arm resonator 151. Furthermore, in the third working example, the average value of the electrode finger pitches (about 2.761 μm to about 2.788 μm, for example) of the IDT electrode of the serial arm resonator 151 is equal to or more than the minimum electrode finger pitch (the electrode finger pitch of the serial arm resonator 153: about 2.732 μm, for example) and is equal to or less than the maximum electrode finger pitch (the electrode finger pitch of the serial arm resonator 152: about 2.804 μm, for example), among the electrode finger pitches respectively included in the three serial arm resonators 152 to 154 excluding the serial arm resonator 151.

According to the transmission-side filter 13 according to each of the second working example and the third working example, the average pitch of the IDT electrode of the serial arm resonator 151 is within a range of the electrode finger pitches of the other serial arm resonators 152 to 154. Accordingly, it is possible to avoid fluctuation of the resonant frequency and the anti-resonant frequency of the serial arm resonator 151 defining an attenuation pole in the pass band and in the vicinity of the pass band of the transmission-side filter 13 to such an extent that the pass band of the transmission-side filter 13 is deteriorated, and thus it is possible to maintain the bandpass characteristics of the transmission-side filter 13.

Furthermore, in the second working example, a difference (about 0.056 μm, for example) between the minimum electrode finger pitch (about 2.747 μm, for example) and the maximum electrode finger pitch (about 2.803 μm, for example) of the IDT electrode of the serial arm resonator 151 is equal to or less than a difference (about 0.072 μm, for example) between the minimum electrode finger pitch (the electrode finger pitch of the serial arm resonator 153: about 2.732 μm, for example) and the maximum electrode finger pitch (the electrode finger pitch of the serial arm resonator 152: about 2.804 μm, for example) among the electrode finger pitches respectively included in the three serial arm resonators 152 to 154 excluding the serial arm resonator 151. Furthermore, in the third working example, a difference (about 0.027 μm, for example) between the minimum electrode finger pitch (about 2.761 μm, for example) and the maximum electrode finger pitch (about 2.788 μm, for example) of the IDT electrode of the serial arm resonator 151 is equal to or less than a difference (about 0.072 μm, for example) between the minimum electrode finger pitch (the electrode finger pitch of the serial arm resonator 153: about 2.732 μm, for example) and the maximum electrode finger pitch (the electrode finger pitch of the serial arm resonator 152: about 2.804 μm, for example) among the electrode finger pitches respectively included in the three serial arm resonators 152 to 154 excluding the serial arm resonator 151.

According to the transmission-side filter 13 according to each of the second working example and the third working example, the average pitch of the IDT electrode of the serial arm resonator 151 is within the range of the electrode finger pitches of the other serial arm resonators 152 to 154, and the difference between the minimum electrode finger pitch and the maximum electrode finger pitch of the IDT electrode is equal to or less than the difference between the minimum electrode finger pitch and the maximum electrode finger pitch of the other serial arm resonators. In the acoustic wave resonator including the IDT electrode, the Q value of the acoustic wave resonator increases when the electrode finger pitch is uniform or substantially uniform, and the Q value decreases as the electrode finger pitch varies. According to the configuration of each of the second working example and the third working example, since dropping of the Q value of the serial arm resonator 151 can be reduced or prevented, and it is possible to reduce insertion loss in the pass band of the transmission-side filter 13.

Note that in the transmission-side filter 13 according to each of the second working example and the third working example, it is preferable that the IDT electrode of the serial arm resonator 152 have an equal or substantially equal electrode finger pitch in the arrangement direction, the IDT electrode of the serial arm resonator 153 have an equal or substantially equal electrode finger pitch in the arrangement direction, and the IDT electrode of the serial arm resonator 154 have an equal or substantially equal electrode finger pitch in the arrangement direction. Furthermore, it is preferable that the parallel arm resonator 251 have an equal or substantially equal electrode finger pitch in the arrangement direction, the parallel arm resonator 252 have an equal or substantially equal electrode finger pitch in the arrangement direction, and the parallel arm resonator 253 have an equal or substantially equal electrode finger pitch in the arrangement direction. That is, it is preferable that the IDT electrode of each of the resonators excluding the serial arm resonator 151 have an equal or substantially equal electrode finger pitch in the above-described arrangement direction. With this configuration, since the electrode finger pitch of the IDT electrode of each of the acoustic wave resonators excluding the serial arm resonator 151 connected closest to the common terminal 90 is uniform or substantially uniform, it is possible to maintain the high Q value of the acoustic wave resonators. Accordingly, it is possible to effectively reduce or prevent increase in insertion loss that is the bandpass characteristics of the transmission-side filter 13 while reducing or preventing the occurrence of the intermodulation distortion in the transmission-side filter 13.

Note that the transmission-side filter 13 according to each of the second working example and the third working example may be an acoustic wave filter including the serial arm resonator 151 and the parallel arm resonator 251, and a longitudinally coupled resonator. In this case, in the IDT electrode of the serial arm resonator 151, the electrode finger pitch $P_C$ at the center portion in the arrangement direction of the plurality of electrode fingers is maximum among the electrode finger pitches of the IDT electrode, and the electrode finger pitches $P_L$ and $P_R$ at the end portions in the arrangement direction are minimum among the electrode finger pitches of the IDT electrode. In addition, in the plurality of IDT electrodes defining the longitudinally coupled resonator, the electrode finger pitch may not be uniform or substantially uniform in the arrangement direction.

Note that the present preferred embodiment describes that, in the first filter, the resonator that causes the occurrence of the intermodulation distortion is the serial arm resonator 101 or 151 which is connected closest to the common terminal 90. However, the parallel arm resonators 201 or 251 connected closest to the common terminal 90 and the reception-side filter 12 also cause the occurrence of intermodulation distortion. Accordingly, a multiplexer according to a preferred embodiment of the present invention may have a configuration such that, among the plurality of parallel arm resonators constituting the first filter, in each of the parallel arm resonators 201 (first working example) and 251 (second working example and third working example) connected closest to the common terminal 90, the electrode finger pitch at the center portion in the arrangement direction of the plurality of electrode fingers is maximum among the electrode finger pitches of the IDT electrode, and the electrode finger pitches at the end portions in the arrangement direction are minimum among the electrode finger pitches of the IDT electrode.

Furthermore, a multiplexer according to a preferred embodiment of the present invention may have a configuration such that, in a case where a resonator which is connected closest to the common terminal 90 is a parallel arm resonator in the first filter, in at least one of the parallel arm resonator (first parallel arm resonator) connected closest to the common terminal among the parallel arm resonators defining the first filter and the serial arm resonator (first serial arm resonator) connected closest to the common terminal among the serial arm resonators defining the first filter, the electrode finger pitch at the center portion in the arrangement direction of the plurality of electrode fingers is maximum among the electrode finger pitches of the IDT electrode, and the electrode finger pitches at the end portions in the arrangement direction are minimum among the electrode finger pitches of the IDT electrode.

In the above configuration, in at least one of the first serial arm resonator and the first parallel arm resonator that are close to the common terminal and the second filter, the electrode finger pitch of the center portion, where the largest distortion occurs, of the IDT electrode is made large. Furthermore, the electrode finger pitches of the end portions are made small by an amount corresponding to enlarging the electrode finger pitch of the center portion. This makes it possible to reduce or prevent the distortion in the IDT electrode and improve the linearity of the first filter without changing the resonant frequency of the at least one acoustic wave resonator described above and without increasing the size of the acoustic wave resonator. Accordingly, it is possible to provide a small-sized multiplexer in which the occurrence of the intermodulation distortion is reduced or prevented even when the high-frequency signal input to the first filter is increased, and the deterioration in the bandpass characteristics of the first filter and the second filter is reduced or prevented.

Furthermore, as described above, in the multiplexer having the configuration in which, in the parallel arm resonator (first parallel arm resonator) connected closest to the common terminal among the plurality of parallel arm resonators of the first filter, the electrode finger pitch at the center portion in the arrangement direction of the plurality of electrode fingers is maximum among the electrode finger pitches of the IDT electrode, and the electrode finger pitches at the end portions in the arrangement direction are minimum among the electrode finger pitches of the IDT electrode, the average value of the electrode finger pitches of the IDT electrode of the first parallel arm resonator may be equal to or more than the minimum electrode finger pitch and equal to or less than the maximum electrode finger pitch among the electrode finger pitches respectively included in the plurality of parallel arm resonators excluding the first parallel arm resonator.

According to this configuration, the average pitch of the IDT electrode of the first parallel arm resonator is within a range of the electrode finger pitches of the other parallel arm resonators. Accordingly, it is possible to avoid fluctuation of the resonant frequency and the anti-resonant frequency of the first parallel arm resonator defining an attenuation pole in the pass band and in the vicinity of the pass band of the first filter to such an extent that the pass band of the first filter is deteriorated, and thus it is possible to maintain the bandpass characteristics of the first filter.

Furthermore, a difference between the minimum electrode finger pitch and the maximum electrode finger pitch of the IDT electrode of the first parallel arm resonator may be equal to or less than a difference between the minimum electrode finger pitch and the maximum electrode finger pitch among the electrode finger pitches respectively included in the plurality of parallel arm resonators excluding the first parallel arm resonator.

According to this configuration, the average pitch of the IDT electrode of the first parallel arm resonator is within the range of the electrode finger pitches of the other parallel arm resonators, and the difference between the minimum electrode finger pitch and the maximum electrode finger pitch of the IDT electrode is equal to or less than the difference between the minimum electrode finger pitch and the maximum electrode finger pitch of the other parallel arm resonators. Accordingly, since dropping of the Q value of the first parallel arm resonator can be reduced or prevented, and it is possible to reduce insertion loss in the pass band of the first filter.

7. Configuration of Transmission-Side Filter 16 According to Fourth Working Example Hereinafter, the circuit configuration of a transmission-side filter 16 of a multiplexer 1B according to a fourth working example will be described with reference to FIG. 9.

A multiplexer 1B includes a transmission-side filter 16 and a reception-side filter 17.

The transmission-side filter 16 include serial arm resonators 181, 182, 183, and 184, and parallel arm resonators 281, 282, and 283.

The serial arm resonators 181 to 184 are provided on a path connecting the common terminal 90 and the transmission input terminal 91, and are connected in series to one another. Furthermore, the parallel arm resonators 281 to 283 are each provided between a node on the path and the reference terminal (ground). The parallel arm resonator 283 includes acoustic wave resonators 283a, 283b, and 283c, and is a circuit in which the acoustic wave resonators 283b and 203c are connected in series and the acoustic wave resonator 203a are connected in parallel.

The transmission-side filter 16 defines a ladder band pass filter by the above-described connection configuration of the serial arm resonators 181 to 184, and the parallel arm resonators 281 to 283. Note that the number of serial arm resonators and parallel arm resonators is not limited to the above-described configuration.

8. Configuration of IDT Electrode of Serial Arm Resonator 181 According to Fourth Working Example When a plurality of filters are commonly-connected at an antenna terminal, intermodulation distortion might occur at a resonator connected closest to the antenna terminal. In the transmission-side filter 16, for example, intermodulation distortion might occur at the serial arm resonator 181 connected closest to the common terminal 90. When intermodulation occurs in the transmission-side filter 16, its higher harmonic wave adversely affects the reception-side filter 17 to deteriorate its reception sensitivity.

Intermodulation distortion occurring at the serial arm resonator 181 connected closest to the common terminal 90 can be effectively reduced or prevented by improving linearity of the series arm resonator 181. A resonator can be improved in linearity by reducing an electrode duty ratio of an IDT electrode defining the resonator. However, by reducing an electrode duty ratio of an IDT electrode of a resonator, dimensional accuracy of the IDT electrode might vary during a manufacturing process, which might lead to variation in its properties.

Figure 10:
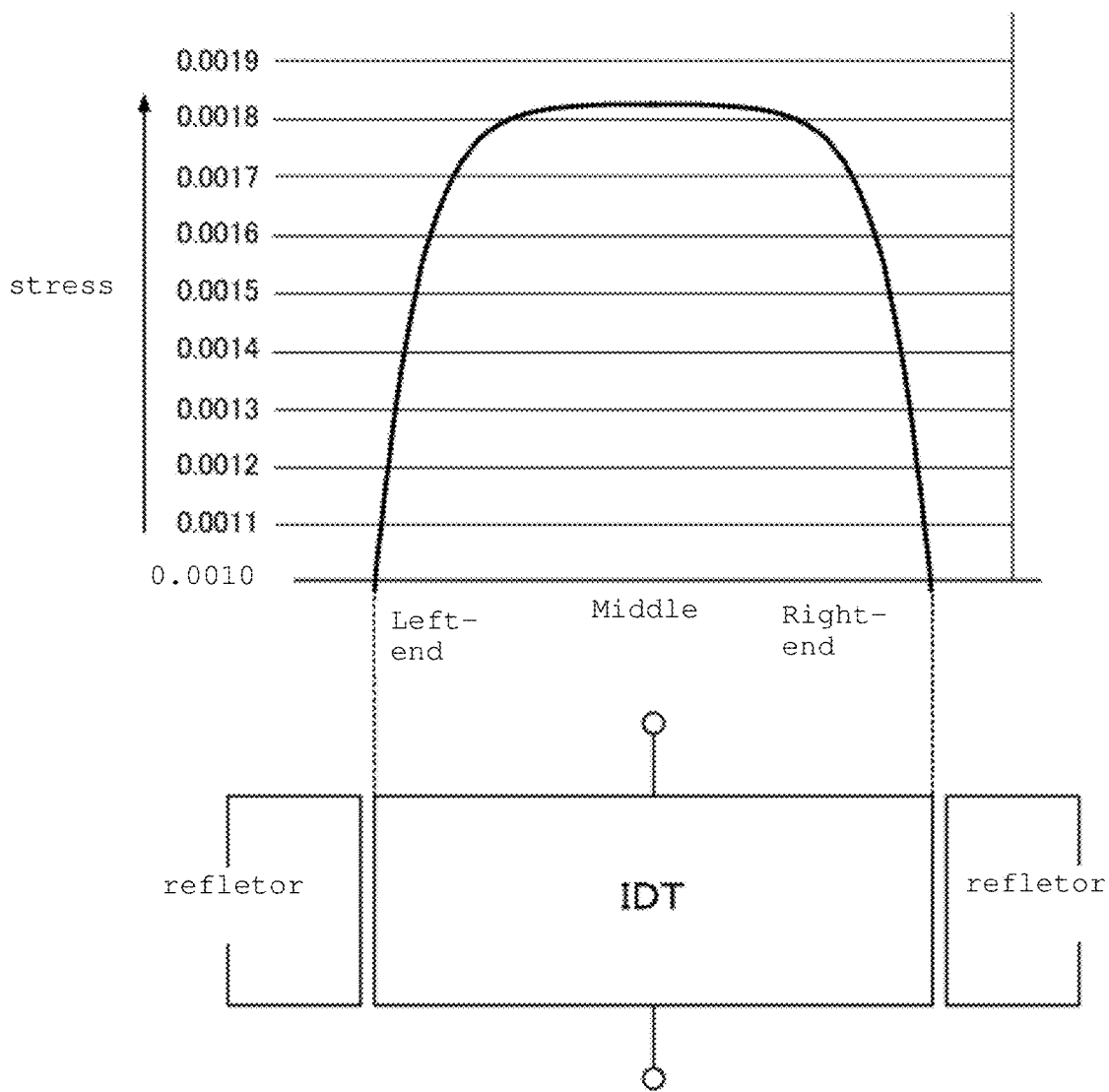
FIG. 10 is a figure illustrating stress distribution within a resonator.

FIG. 10 is a figure illustrating stress distribution within a resonator. As is illustrated in FIG. 10, within a resonator, stress is larger in the middle portion and is smaller at the both end portions of an IDT electrode. Consequently, intermodulation distortion is more likely to occur in the middle portion and less likely to occur in the both end portions of the IDT electrode.

Thus, the serial arm resonator 181 of the transmission-side filter 16 according to the fourth working example includes a region in which an electrode duty ratio is continuously increased from the middle portion to the end portion in the direction of arrangement of a plurality of electrode fingers. An explanation will be provided with a specific example, FIG. 11.

Figure 11:
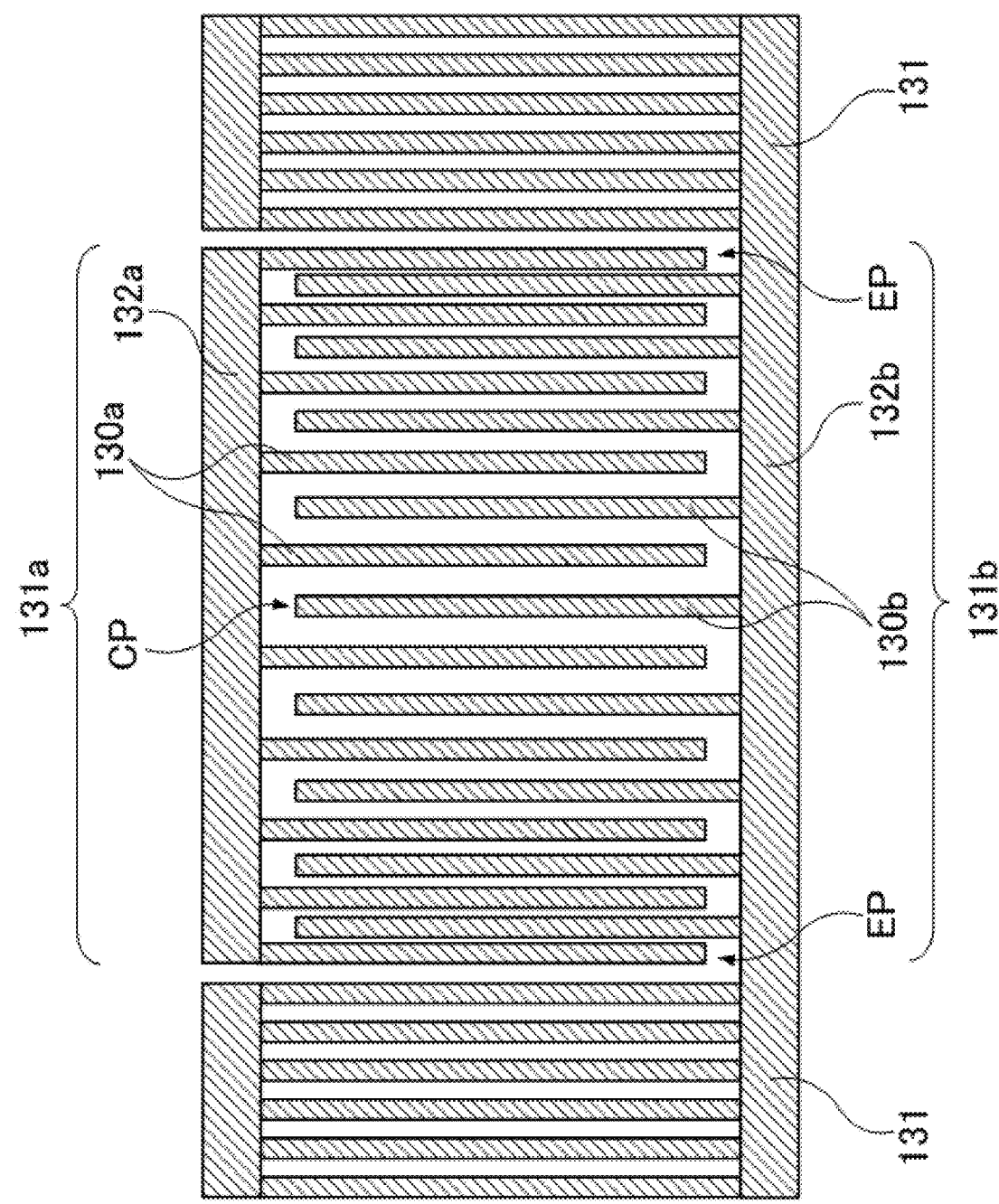
FIG. 11 is a schematic plan view illustrating an electrode configuration of an initial stage-side acoustic wave resonator of the transmission-side filter according to the fourth working example.

As illustrated in FIG. 11, the serial arm resonator 181 includes comb tooth-shaped electrodes 131*a* and 131*b* and reflectors 131. The comb tooth-shaped electrode 131*a* includes a plurality of electrode fingers 130*a* that are parallel or substantially parallel to one another and a busbar electrode 132*a* that connects the plurality of electrode fingers 130*a* to one another. Furthermore, the comb tooth-shaped electrode 131*b* includes a plurality of electrode fingers 130*b* that are parallel or substantially parallel to one another and a busbar electrode 132*b* that connects the plurality of electrode fingers 130*b* to one another. The comb tooth-shaped electrodes 131*a* and 131*b* are arranged so as to face each other such that the plurality of electrode fingers 130*a* and the plurality of electrode fingers 130*b* interdigitate with each other. In the serial arm resonator 181, each of the plurality of the electrode fingers 130*a* and 130*b* has a constant or substantially constant line width.

The IDT electrode of the serial arm resonator 181 of the transmission-side filter 16 according to the fourth working example includes a region in which an electrode duty ratio is continuously increased from the middle portion CP to the end portion EP in the direction of arrangement of a plurality of electrode fingers.

Separately, a multiplexer according to a third comparative example is prepared. The multiplexer according to the third comparative example includes an IDT electrode which is the same as or similar to the IDT electrode of the serial arm resonator 181 according to the fourth working example except for an electrode duty and a wavelength (an electrode finger pitch); specifically, in the third comparative example, an electrode duty ratio is about 0.5 and a wavelength is about 4.6 µm throughout the IDT electrode of a serial arm resonator connected closest to the common terminal 90.

Figure 12:
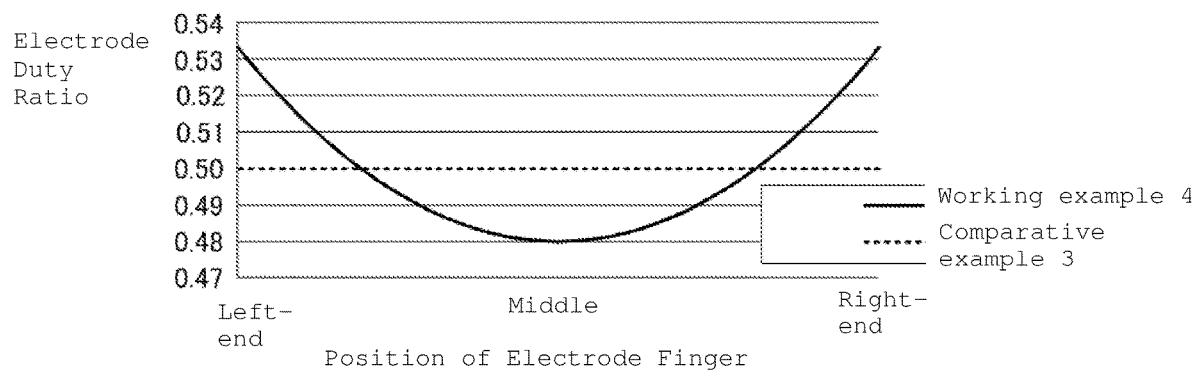
FIG. 12 is a graph showing the relationship between a position and an electrode duty ratio of an electrode finger of an initial stage-side acoustic wave resonator of the transmission-side filter according to the fourth working example and a third comparative example.

FIG. 12 illustrates the relationship between a position of an electrode finger and an electrode duty ratio of the IDT electrode of the serial arm resonator 181. An electrode duty ratio is about 0.48 in the middle portion CP, and is about 0.53 in the end portion EP, in the direction of arrangement of a plurality of electrode fingers 130*a* and 130*b*. An electrode duty in the third comparative example is also illustrated in FIG. 12.

In the serial arm resonator 181 of the transmission-side filter 16 according to the fourth working example, an occurrence of an intermodulation distortion can be effectively reduced or prevented by decreasing an electrode duty ratio in the middle portion CP of the IDT electrode in which a distortion is more likely to occur, and concurrently, variation in properties due to variation during a manufacturing process can also be reduced or prevented by increasing an electrode duty ratio in the end potion EP of the IDT electrode in which a distortion is less likely to occur. Consequently, a resonator having excellent linearity and property-accuracy can be obtained.

Figure 13:
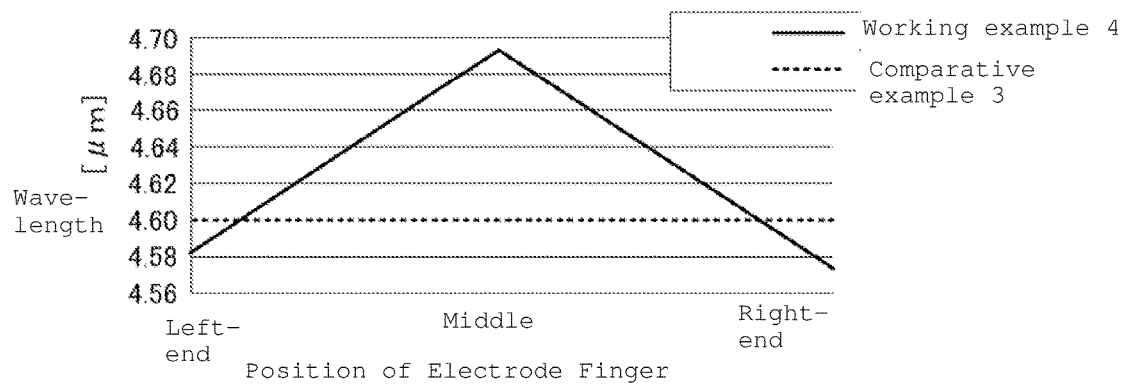
FIG. 13 is a graph showing the relationship between a position and a wavelength of an electrode finger of an initial stage-side acoustic wave resonator of the transmission-side filter according to the fourth working example and the third comparative example.

FIG. 13 illustrates the relationship between a position of an electrode finger and a wavelength of the IDT electrode of the serial arm resonator 181. A wavelength is larger in the middle portion CP, and is smaller in the end portion EP. Thus by reducing an electrode finger pitch from the middle portion CP to the end portion EP, a deterioration in pass characteristics can be effectively reduced or prevented in the serial arm resonator 181. A wavelength in the third comparative example is also illustrated in FIG. 13.

Figure 14:
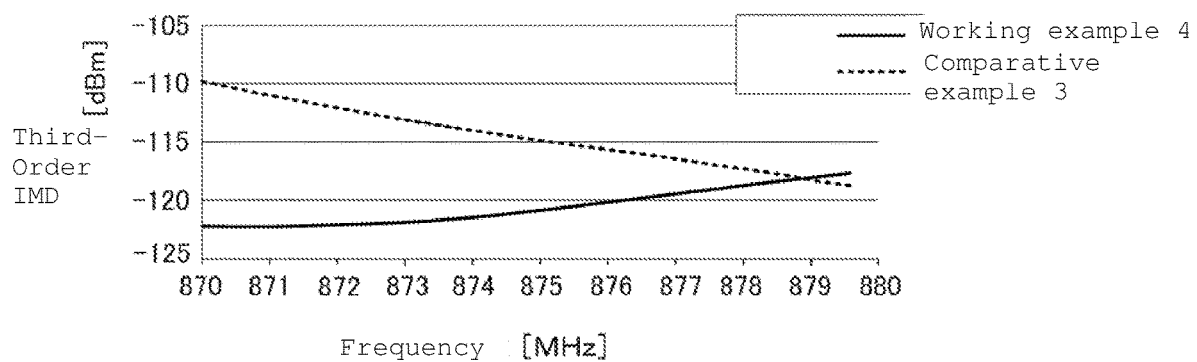
FIG. 14 is a graph showing the relationship between a frequency and a third-order harmonic wave distortion of the transmission-side filter according to the fourth working example and the third comparative example.
Figure 15:
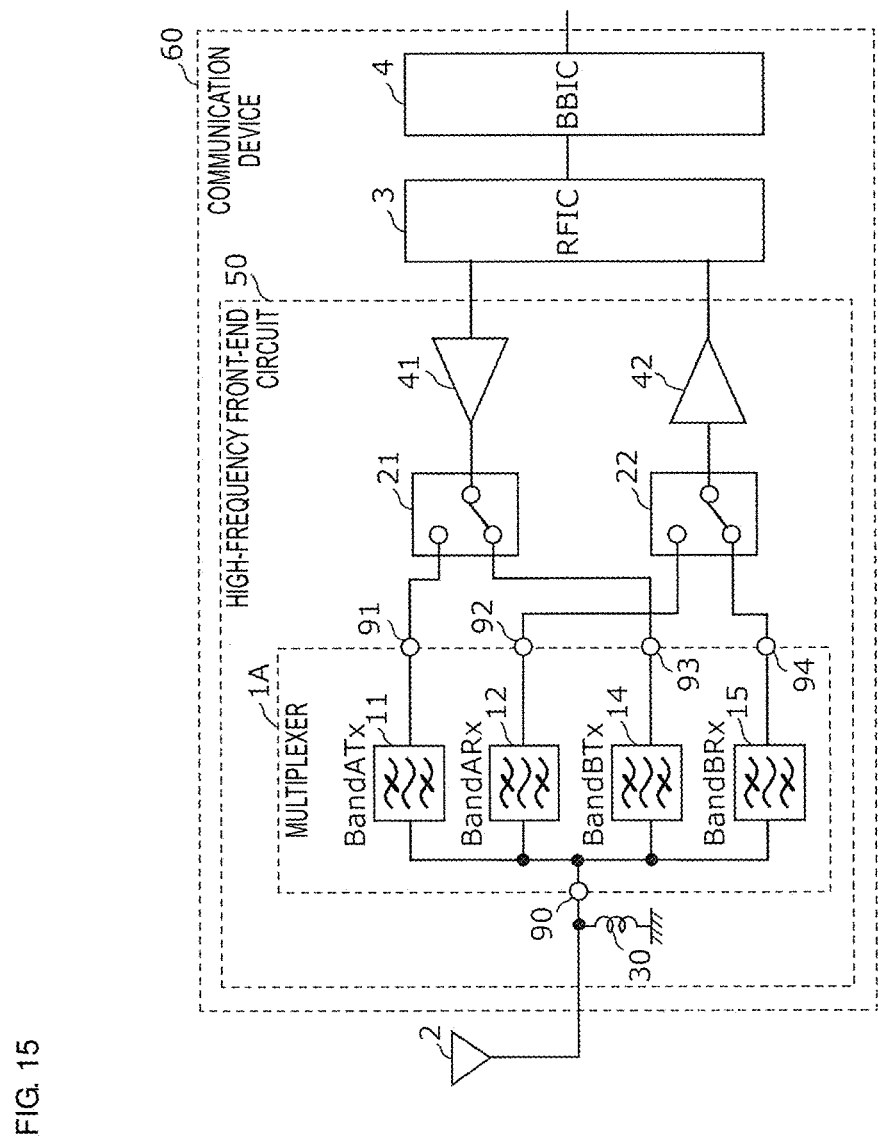
FIG. 15 is a diagram of a communication device according to a second preferred embodiment of the present invention.

FIG. 14 illustrates the relationship between a frequency and a third-order intermodulation distortion occurring in the transmission-side filter 16 according to the fourth working example and the third comparative example. As illustrated in FIG. 14, in the transmission-side filter 16 according to the fourth working example an occurrence of a third-order intermodulation distortion is reduced or prevented in a wider frequency band than in the transmission-side filter 16 according to the third comparative example.

While in the fourth working example, the electrode duty ratio of the IDT electrode of the serial arm resonator 181 is changed within the range from about 0.48 to about 0.53, a resonator having a higher linearity can be obtained by changing the electrode duty ratio of the IDT electrode within the range from about 0.45 to about 0.55, for example. Furthermore, while in the fourth working example, the electrode duty ratio of the IDT electrode is changed in the serial arm resonator connected closest to the antenna terminal (common terminal 90), an electrode duty ratio of an IDT electrode of a parallel arm resonator can be also changed when the parallel arm resonator is connected closest to the antenna terminal.

Second Preferred Embodiment

The multiplexer 1 according to the first preferred embodiment can be applied to a high-frequency front-end circuit, and furthermore to a communication device including the high-frequency front-end circuit. Accordingly, in the present preferred embodiment, such a high-frequency front-end circuit and a communication device will be described.

Figure 9:
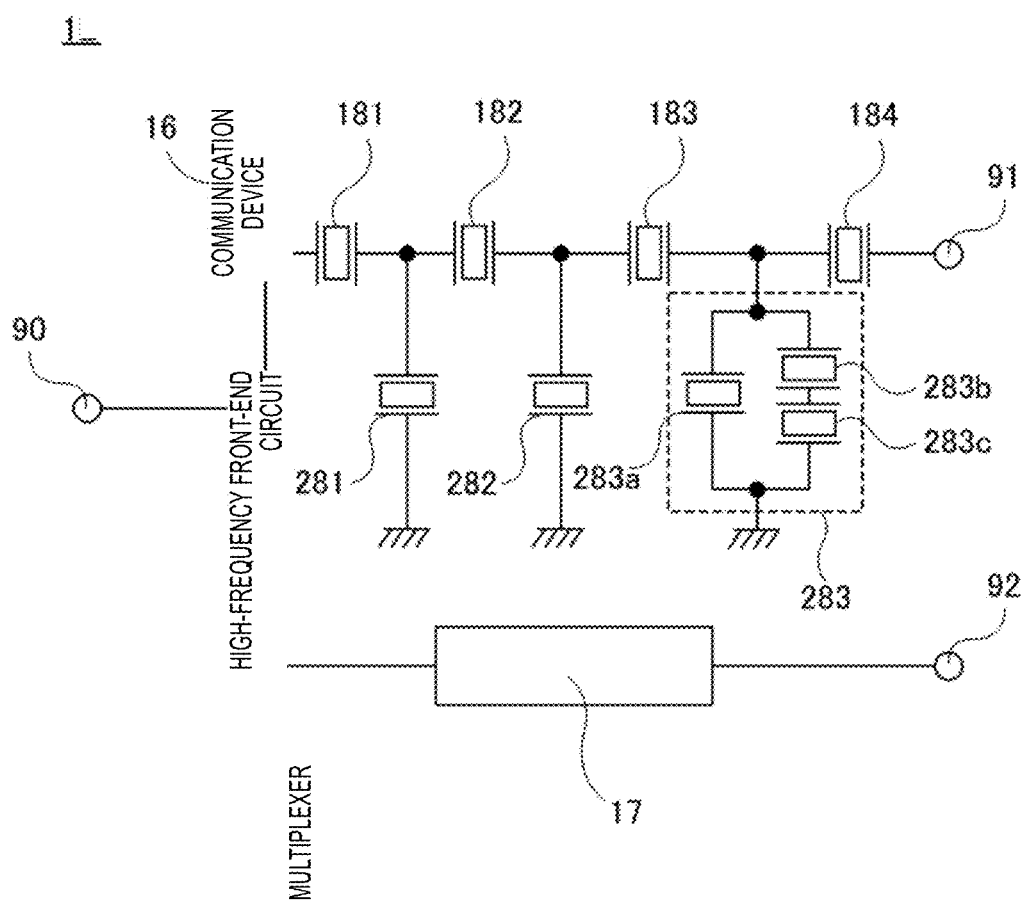
FIG. 9 is a circuit diagram of a multiplexer according to a fourth working example.

FIG. 9 is a diagram of a communication device 60 according to a second preferred embodiment of the present invention. The communication device 60 includes a high-frequency front-end circuit 50, an RF signal processing circuit 3, and a baseband signal processing circuit 4. Note that the antenna element 2 connected to the communication device 60 is also illustrated in the diagram.

The high-frequency front-end circuit 50 includes a multiplexer 1A, the inductance element 30, a transmission-side switch 21, a reception-side switch 22, and a power amplifier circuit 41 and a low noise amplifier circuit 42.

The multiplexer 1A includes the transmission-side filter 11 and a transmission-side filter 14, reception-side filters 12 and 15, the common terminal 90, the transmission input terminal 91 and a transmission input terminal 93, and the reception output terminal 92 and a reception output terminal 94. The inductance element 30 providing impedance matching is connected between a connection path between the common terminal 90 and the antenna element 2 and a ground defining and functioning as a reference terminal. Note that the inductance element 30 may be connected in series between the common terminal 90 and the antenna element 2. Furthermore, the multiplexer 1A may be configured so as to include the inductance element 30.

The transmission-side filter 11 is the transmission-side filter 11 according to the first preferred embodiment, and is a first filter that is connected to the common terminal 90 and the transmission input terminal 91 (first input and output terminal), receives a transmission wave generated by a transmission circuit (RFIC or the like) and input thereto through the transmission input terminal 91, and filters the transmission wave with the transmission pass band of Band A and outputs the result to the common terminal 90.

The reception-side filter 12 is the reception-side filter 12 according to the first preferred embodiment, and is a second filter that is connected to the common terminal 90 and the reception output terminal 92, receives a reception wave input thereto from the common terminal 90, and filters the reception wave with the reception pass band of Band A and outputs the result to the reception output terminal 92.

The transmission-side filter 14 is connected to the common terminal 90 and the transmission input terminal 93, receives a transmission wave generated by a transmission circuit (RFIC or the like) and input thereto through the transmission input terminal 93, and filters the transmission wave with a transmission pass band of Band B and outputs the result to the common terminal 90.

The reception-side filter 15 is connected to the common terminal 90 and the reception output terminal 94, receives a reception wave input thereto from the common terminal 90, and filters the reception wave with a reception pass band of Band B and outputs the result to the reception output terminal 94.

Note that the transmission-side filter 14 and the reception-side filter 15 are not particularly limited in configuration and may each be, for example, an acoustic wave filter, or may each be an LC filter including an inductance element and a capacitance element.

Furthermore, at least one of an inductance element and a capacitance element providing impedance matching may be connected between the common terminal 90 and each of the above-described filters.

According to the multiplexer 1A according to the present preferred embodiment, it is possible to reduce or prevent the distortion in the IDT electrode and improve the linearity of the transmission-side filter 11 without changing the resonant frequency of the serial arm resonator 101 and without increasing the size of the acoustic wave resonator due to division or the like. Accordingly, it is possible to provide the multiplexer 1A reduced in size in which the occurrence of the intermodulation distortion is reduced or prevented even when the high-frequency signal input to the transmission-side filter 11 is increased, and the deterioration in the bandpass characteristics of the transmission-side filters 11 and 14 and the reception-side filters 12 and 15 is reduced or prevented.

The transmission-side switch 21 is a switch circuit including two selection terminals respectively connected to the transmission input terminals 91 and 93 of the multiplexer 1A, and a common terminal connected to the power amplifier circuit 41.

The reception-side switch 22 is a switch circuit including two selection terminals respectively connected to the reception output terminals 92 and 94 of the multiplexer 1A, and a common terminal connected to the low noise amplifier circuit 42.

Each of the transmission-side switch 21 and the reception-side switch 22 connects the common terminal and a signal path corresponding to a predetermined band in accordance with a control signal from a control unit (not illustrated), and is preferably, for example, an SPDT (Single Pole Double Throw) type switch. Note that the number of selection terminals connected to the common terminal is not limited to one, and a plurality of selection terminals may be connected thereto. That is, the high-frequency front-end circuit 50 may support carrier aggregation.

The power amplifier circuit 41 is a transmission amplification circuit that amplifies a high-frequency signal (here, a high-frequency transmission signal) output from the RF signal processing circuit 3 and outputs the amplified signal to the antenna element 2 through the transmission-side switch 21 and the multiplexer 1A.

The low noise amplifier circuit 42 is a reception amplification circuit that amplifies a high-frequency signal (here, a high-frequency reception signal) that has passed through the antenna element 2, the multiplexer 1A, and the reception-side switch 22, and outputs the amplified signal to the RF signal processing circuit 3.

Note that the power amplifier circuit may include amplification elements corresponding to, for example, Band A and Band B, respectively. In that case, the transmission-side switch 21 may not be provided. Furthermore, the low noise amplifier circuit may include amplification elements corresponding to, for example, Band A and Band B, respectively. In that case, the reception-side switch 22 may not be provided.

The RF signal processing circuit 3 performs signal processing on the high-frequency reception signal input from the antenna element 2 through the reception signal path by down-conversion or the like, and outputs the reception signal generated by the signal processing to the baseband signal processing circuit 4. In addition, the RF signal processing circuit 3 performs signal processing on the transmission signal input from the baseband signal processing circuit 4 by up-conversion or the like, and outputs the high-frequency transmission signal generated by the signal processing to the power amplifier circuit 41. The RF signal processing circuit 3 is preferably, for example, an RFIC.

The signal processed by the baseband signal processing circuit 4 is used, for example, for image display as an image signal, or for a call as a voice signal.

Note that the high-frequency front-end circuit 50 may include another circuit element between the above-described elements.

According to the high-frequency front-end circuit 50 and the communication device 60 configured as described above, by including the multiplexer 1A, it is possible to provide the high-frequency front-end circuit 50 and the communication device 60, which are reduced in size, in which the occurrence of the intermodulation distortion is reduced or prevented even when the high-frequency signal input to the transmission-side filter 11 is increased, and deterioration in the bandpass characteristics of the respective filters of the multiplexer 1A is reduced or prevented.

Note that the communication device 60 may not include the baseband signal processing circuit (BBIC) 4 in accordance with a processing scheme of the high-frequency signal.

Although, the multiplexer 1 according to the first preferred embodiment and the high-frequency front-end circuit 50 and the communication device 60 according to the second preferred embodiment have been described above using the examples of the preferred embodiments, the present invention is not limited to the above-described preferred embodiments. For example, the following modifications to the above-described preferred embodiments may also be included in the present invention.

For example, although, in the above description, as the multiplexer 1 according to the first preferred embodiment, a duplexer which is applied to Band A has been described as an example, and as the multiplexer 1A according to the second preferred embodiment, a quadplexer which is applied to Band A and Band B has been described as an example, the present invention can be applied to, for example, a triplexer in which antenna connection terminals of three filters are made common, a hexaplexer in which three duplexers are commonly connected by a common terminal, and the like. That is, it is sufficient that the multiplexer is provided with two or more filters.

Furthermore, the multiplexer according to preferred embodiments of the present invention is not limited to the configuration including both the transmission-side filter and the reception-side filter, and may include only a plurality of transmission-side filters or only a plurality of reception-side filters.

Furthermore, the first preferred embodiment describes that the transmission-side filter 11 applied to Band A corresponds to the first filter, and the reception-side filter 12 applied to Band A corresponds to the second filter. However, the present invention can be applied to any multiplexer in which the frequency of the IMD component caused by the first filter is within the pass band of the second filter, without being limited to applications of the first filter and the second filter or the like.

Preferred embodiments of the present invention can be widely used for communication apparatuses such as a mobile phone or the like, for example, as a multiplexer, a high-frequency front-end circuit, a communication device, or the like, with low-loss and small-size, that can be applied to a multi-band and multi-mode frequency standard.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal, a first input and output terminal, and a second input and output terminal;
a first filter connected to the common terminal and the first input and output terminal; and
a second filter connected to the common terminal and the second input and output terminal and having a pass band that is different from a pass band of the first filter; wherein
the first filter includes:
one or more serial arm resonators on a path connecting the common terminal and the first input and output terminal; and
one or more parallel arm resonators between the path and a ground;
each of the one or more serial arm resonators and the one or more parallel arm resonators is an acoustic wave resonator including an interdigital transducer electrode provided on a substrate having piezoelectricity, and the interdigital transducer electrode includes a plurality of electrode fingers parallel or substantially in parallel to one another; and
in the interdigital transducer electrode included in at least one of a first serial arm resonator connected closest to the common terminal among the one or more serial arm resonators and a first parallel arm resonator connected closest to the common terminal among the one or more parallel arm resonators, an electrode finger pitch at a center portion in an arrangement direction of the plurality of electrode fingers is maximum among electrode finger pitches of the interdigital transducer electrode, and electrode finger pitches at both end portions in the arrangement direction are minimum among the electrode finger pitches of the interdigital transducer electrode.

2. The multiplexer according to claim 1, wherein
the one or more serial arm resonators include a plurality of serial arm resonators;
an electrode finger pitch of the interdigital transducer electrode of each of the plurality of serial arm resonators excluding the first serial arm resonator is uniform or substantially uniform in the arrangement direction;
the one or more parallel arm resonators include a plurality of parallel arm resonators; and
an electrode finger pitch of the interdigital transducer electrode of each of the plurality of parallel arm resonators excluding the first parallel arm resonator is uniform or substantially uniform in the arrangement direction.

3. The multiplexer according to claim 2, wherein
the plurality of serial arm resonators include three or more serial arm resonators including the first serial arm resonator;
in the interdigital transducer electrode included in the first serial arm resonator, the electrode finger pitch at the center portion in the arrangement direction of the plurality of electrode fingers is maximum among the electrode finger pitches of the interdigital transducer electrode, the electrode finger pitches at both the end portions in the arrangement direction are minimum among the electrode finger pitches of the interdigital transducer electrode; and
an average value of the electrode finger pitches of the interdigital transducer electrode of the first serial arm resonator is equal to or more than a minimum electrode finger pitch and equal to or less than a maximum electrode finger pitch among electrode finger pitches respectively included in the three or more serial arm resonators excluding the first serial arm resonator.

4. The multiplexer according to claim 3, wherein a difference between the minimum electrode finger pitch and the maximum electrode finger pitch of the interdigital transducer electrode of the first serial arm resonator is equal to or less than a difference between the minimum electrode finger pitch and the maximum electrode finger pitch among the electrode finger pitches respectively included in the three or more serial arm resonators excluding the first serial arm resonator.

5. The multiplexer according to claim 2, wherein
the one or more parallel arm resonators include three or more parallel arm resonators including the first parallel arm resonator;
in the interdigital transducer electrode included in the first parallel arm resonator, the electrode finger pitch at the center portion in the arrangement direction of the plurality of electrode fingers is maximum among the electrode finger pitches of the interdigital transducer electrode, the electrode finger pitches at both the end portions in the arrangement direction are minimum among the electrode finger pitches of the interdigital transducer electrode; and
an average value of the electrode finger pitches of the interdigital transducer electrode of the first parallel arm resonator is equal to or more than a minimum electrode finger pitch and equal to or less than a maximum electrode finger pitch among electrode finger pitches respectively included in the three or more parallel arm resonators excluding the first parallel arm resonator.

6. The multiplexer according to claim 5, wherein a difference between the minimum electrode finger pitch and the maximum electrode finger pitch of the interdigital transducer electrode of the first parallel arm resonator is equal to or less than a difference between the minimum electrode finger pitch and the maximum electrode finger pitch among the electrode finger pitches respectively included in the three or more parallel arm resonators excluding the first parallel arm resonator.

7. The multiplexer according to claim 1, wherein in the interdigital transducer electrode included in the at least one of a first serial arm resonator connected closest to the common terminal among the one or more serial arm resonators and the first parallel arm resonator connected closest to the common terminal among the one or more parallel arm resonators, the electrode finger pitch is continuously decreased from the center portion toward the end portions in the arrangement direction.

8. The multiplexer according to claim 1, wherein
the interdigital transducer electrode includes a plurality of electrode finger regions including three or more adjacent electrode fingers in the arrangement direction;
each of the plurality of electrode finger regions has a uniform or substantially uniform electrode finger pitch; and
the electrode finger pitches are reduced from an electrode finger region in a center portion of the interdigital transducer electrode toward electrode finger regions in end portions.

9. The multiplexer according to claim 1, wherein the first filter has a ladder filter structure.

10. The multiplexer according to claim 1, wherein
the substrate includes:
a piezoelectric film on one surface of which the interdigital transducer electrode is provided;
a high acoustic velocity support substrate in which a propagating bulk wave acoustic velocity is higher than an acoustic wave acoustic velocity propagating in the piezoelectric film; and
a low acoustic velocity film between the high acoustic velocity support substrate and the piezoelectric film and in which a propagating bulk wave acoustic velocity is lower than a bulk wave acoustic velocity propagating in the piezoelectric film.

11. The multiplexer according to claim 1, wherein
the first filter is a transmission-side filter having a portion in a predetermined frequency band as a transmission band; and
the second filter is a reception-side filter having another portion in the predetermined frequency band as a reception band.

12. The multiplexer according to claim 1, wherein in the interdigital transducer electrode included in the at least one of a first serial arm resonator connected closest to the common terminal among the one or more serial arm resonators and a first parallel arm resonator connected closest to the common terminal among the one or more parallel arm resonators, an electrode duty ratio is continuously increased from the center portion toward the end portions in the arrangement direction.

13. The multiplexer according to claim 12, wherein the electrode duty ratio is within a range from about 0.45 to about 0.55.

14. A high-frequency front-end circuit comprising:
the multiplexer according to claim 1; and
an amplification circuit connected to the multiplexer.

15. The high-frequency front-end circuit according to claim 14, wherein
the one or more serial arm resonators include a plurality of serial arm resonators;
an electrode finger pitch of the interdigital transducer electrode of each of the plurality of serial arm resonators excluding the first serial arm resonator is uniform or substantially uniform in the arrangement direction;
the one or more parallel arm resonators include a plurality of parallel arm resonators; and
an electrode finger pitch of the interdigital transducer electrode of each of the plurality of parallel arm resonators excluding the first parallel arm resonator is uniform or substantially uniform in the arrangement direction.

16. The high-frequency front-end circuit according to claim 15, wherein
the plurality of serial arm resonators include three or more serial arm resonators including the first serial arm resonator;
in the interdigital transducer electrode included in the first serial arm resonator, the electrode finger pitch at the center portion in the arrangement direction of the plurality of electrode fingers is maximum among the electrode finger pitches of the interdigital transducer electrode, the electrode finger pitches at both the end portions in the arrangement direction are minimum among the electrode finger pitches of the interdigital transducer electrode; and
an average value of the electrode finger pitches of the interdigital transducer electrode of the first serial arm resonator is equal to or more than a minimum electrode finger pitch and equal to or less than a maximum electrode finger pitch among electrode finger pitches respectively included in the three or more serial arm resonators excluding the first serial arm resonator.

17. The high-frequency front-end circuit according to claim 16, wherein a difference between the minimum electrode finger pitch and the maximum electrode finger pitch of the interdigital transducer electrode of the first serial arm resonator is equal to or less than a difference between the minimum electrode finger pitch and the maximum electrode finger pitch among the electrode finger pitches respectively included in the three or more serial arm resonators excluding the first serial arm resonator.

18. The high-frequency front-end circuit according to claim 15, wherein
the one or more parallel arm resonators include three or more parallel arm resonators including the first parallel arm resonator;
in the interdigital transducer electrode included in the first parallel arm resonator, the electrode finger pitch at the center portion in the arrangement direction of the plurality of electrode fingers is maximum among the electrode finger pitches of the interdigital transducer electrode, the electrode finger pitches at both the end portions in the arrangement direction are minimum among the electrode finger pitches of the interdigital transducer electrode; and
an average value of the electrode finger pitches of the interdigital transducer electrode of the first parallel arm resonator is equal to or more than a minimum electrode finger pitch and equal to or less than a maximum electrode finger pitch among electrode finger pitches respectively included in the three or more parallel arm resonators excluding the first parallel arm resonator.

19. The high-frequency front-end circuit according to claim 18, wherein a difference between the minimum electrode finger pitch and the maximum electrode finger pitch of the interdigital transducer electrode of the first parallel arm resonator is equal to or less than a difference between the minimum electrode finger pitch and the maximum electrode finger pitch among the electrode finger pitches respectively included in the three or more parallel arm resonators excluding the first parallel arm resonator.

20. The high-frequency front-end circuit according to claim 14, wherein in the interdigital transducer electrode included in the interdigital transducer electrode included in the at least one of a first serial arm resonator connected closest to the common terminal among the one or more serial arm resonators and the first parallel arm resonator connected closest to the common terminal among the one or more parallel arm resonators, the electrode finger pitch is continuously decreased from the center portion toward the end portions in the arrangement direction.

21. The high-frequency front-end circuit according to claim 14, wherein
the interdigital transducer electrode includes a plurality of electrode finger regions including three or more adjacent electrode fingers in the arrangement direction;
each of the plurality of electrode finger regions has a uniform or substantially uniform electrode finger pitch; and
the electrode finger pitches are reduced from an electrode finger region in a center portion of the interdigital transducer electrode toward electrode finger regions in end portions.

22. A communication device comprising:
an RF signal processing circuit that processes a high-frequency signal transmitted and received through an antenna element; and
the high-frequency front-end circuit according to claim 14, that transmits the high-frequency signal between the antenna element and the RF signal processing circuit.

* * * * *